(12) United States Patent
Tamaki

(10) Patent No.: US 10,535,827 B2
(45) Date of Patent: Jan. 14, 2020

(54) OPTICAL SENSOR

(71) Applicant: PANASONIC INTELLECTUAL PROPERTY MANAGEMENT CO., LTD., Osaka (JP)

(72) Inventor: Tokuhiko Tamaki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/352,552

(22) Filed: Mar. 13, 2019

(65) Prior Publication Data

US 2019/0214590 A1 Jul. 11, 2019

Related U.S. Application Data

(63) Continuation of application No. 15/665,992, filed on Aug. 1, 2017, now Pat. No. 10,276,818, which is a
(Continued)

(30) Foreign Application Priority Data

Nov. 12, 2015 (JP) ................................. 2015-222063

(51) Int. Cl.
*H01L 27/146* (2006.01)
*H01L 51/42* (2006.01)
(Continued)

(52) U.S. Cl.
CPC .......... *H01L 51/428* (2013.01); *H01L 27/146* (2013.01); *H01L 27/307* (2013.01);
(Continued)

(58) Field of Classification Search
CPC ............................ H01L 27/146; H01L 51/428
(Continued)

(56) References Cited

U.S. PATENT DOCUMENTS 4,698,657 A 10/1987 Watanabe et al.
5,591,963 A 1/1997 Takeda et al.
(Continued)

FOREIGN PATENT DOCUMENTS

JP S60-194345 A 10/1985
JP H01-277746 A 11/1989
(Continued)

OTHER PUBLICATIONS

International Search Report of PCT application No. PCT/JP2016/004649 dated Dec. 20, 2016.
(Continued)

*Primary Examiner* — Sheikh Maruf
(74) *Attorney, Agent, or Firm* — McDermott Will & Emery LLP

(57) ABSTRACT

An optical sensor includes a semiconductor layer including a first region, a second region, and a third region between the first region and the second region, a first electrode, a photoelectric conversion layer between the third region and the first electrode, and voltage supply circuitry applying a voltage between the first electrode and the first region to apply a bias voltage to the photoelectric conversion layer. The photoelectric conversion layer has a characteristic showing how a density of current flowing through the photoelectric conversion layer varies with the bias voltage applied to the photoelectric conversion layer. The characteristic includes a third voltage range where an absolute value of a rate of change of the current density relative to the bias voltage is less than in a first voltage range and a second voltage range, the third voltage range being between the first voltage range and the second voltage range.

18 Claims, 10 Drawing Sheets

Related U.S. Application Data continuation of application No. PCT/JP2016/004649, filed on Oct. 21, 2016.

(51) Int. Cl.

| | | |
|---|---|---|
| *H01L 31/00* | (2006.01) | |
| *H01L 31/10* | (2006.01) | |
| *H04N 5/33* | (2006.01) | |
| *H04N 5/361* | (2011.01) | |
| *H04N 5/374* | (2011.01) | |
| *H04N 9/04* | (2006.01) | |
| *H01L 27/30* | (2006.01) | |
| *H01L 51/00* | (2006.01) | |
| *H01L 51/44* | (2006.01) | |
| *H04N 5/359* | (2011.01) | |
| *H04N 5/369* | (2011.01) | |
| *H04N 5/378* | (2011.01) | |

(52) U.S. Cl.
CPC .............. *H01L 31/00* (2013.01); *H01L 31/10* (2013.01); *H01L 51/0078* (2013.01); *H01L 51/447* (2013.01); *H04N 5/33* (2013.01); *H04N 5/361* (2013.01); *H04N 5/374* (2013.01); *H04N 9/045* (2013.01); *H04N 5/359* (2013.01); *H04N 5/3698* (2013.01); *H04N 5/378* (2013.01); *Y02E 10/549* (2013.01); *Y02P 70/521* (2015.11)

(58) Field of Classification Search
USPC .............................................. 257/40; 438/99
See application file for complete search history.

(56) References Cited

U.S. PATENT DOCUMENTS

| | | | |
|---|---|---|---|
| 2006/0186400 A1 | 8/2006 | Okada et al. | |
| 2011/0011456 A1* | 1/2011 | Han | H01G 9/2031 136/258 |
| 2011/0101325 A1* | 5/2011 | Uetani | C08G 61/122 257/40 |
| 2011/0215227 A1 | 9/2011 | Yon et al. | |
| 2012/0205641 A1* | 8/2012 | Yoshimura | B82Y 10/00 257/40 |
| 2012/0237154 A1 | 9/2012 | Jeong | |
| 2012/0241727 A1* | 9/2012 | Ogita | C09K 11/06 257/40 |
| 2012/0305899 A1* | 12/2012 | Taki | C08G 61/126 257/40 |
| 2013/0009138 A1* | 1/2013 | Seo | C07F 15/0033 257/40 |
| 2013/0027593 A1* | 1/2013 | Enoki | H01L 51/0074 348/294 |
| 2013/0236172 A1 | 9/2013 | Suzuki | |
| 2013/0270545 A1* | 10/2013 | Tanaka | B82Y 10/00 257/40 |
| 2014/0319509 A1* | 10/2014 | Hattori | C08G 61/123 257/40 |
| 2015/0303398 A1* | 10/2015 | Ii | H01L 51/442 257/40 |
| 2016/0285027 A1 | 9/2016 | Hosono et al. | |
| 2017/0040550 A1 | 2/2017 | Yakushiji et al. | |
| 2017/0077413 A1 | 3/2017 | Murata et al. | |
| 2017/0092876 A1 | 3/2017 | Murata et al. | |
| 2017/0162807 A1 | 6/2017 | Moriwaki | |
| 2017/0294485 A1 | 10/2017 | Joei et al. | |
| 2018/0047788 A1 | 2/2018 | Nozawa | |
| 2018/0151742 A1 | 5/2018 | Kurata et al. | |
| 2018/0323390 A1 | 11/2018 | Kaneda | |

FOREIGN PATENT DOCUMENTS

| | | |
|---|---|---|
| JP | H02-137267 A | 5/1990 |
| JP | H08-064793 A | 3/1996 |
| JP | 2008-182088 A | 8/2008 |
| JP | 2011-060830 A | 3/2011 |
| WO | 2010/094233 A1 | 8/2010 |

OTHER PUBLICATIONS

Non-Final Office Action issued in U.S. Appl. No. 15/665,992, dated May 4, 2018.
Notice of Allowance issued in U.S. Appl. No. 15/665,992, dated Dec. 14, 2018.

\* cited by examiner

OPTICAL SENSOR

CROSS-REFERENCE OF RELATED APPLICATIONS

This application is the continuation of U.S. patent application Ser. No. 15/665,992, filed on Aug. 1, 2017, which is a continuation of International Patent Application No. PCT/JP2016/004649, filed on Oct. 21, 2016, which in turn claims the benefit of Japanese Application No. 2015-222063, filed on Nov. 12, 2015, the entire disclosures of which Applications are incorporated by reference herein.

BACKGROUND

1. Technical Field

The present disclosure relates to an optical sensor.

2. Description of the Related Art

An optical detection element has so far been used in an optical detection device, an image sensor, etc. A typical example of the optical detection element is a photoelectric conversion element, such as a photodiode or a phototransistor. As well known, light can be detected by detecting a photocurrent that is generated in the photoelectric conversion element with light irradiation.

Japanese Unexamined Patent Application Publication No. 2011-60830 discloses, in FIG. 2, a thin film transistor (TFT) including, as a gate insulating film, an organic film in which a predetermined compound is dispersed in an organic polymer. A compound of which polarized state is changed with light irradiation is selected as the predetermined compound constituting the organic film. In the thin film transistor disclosed in Japanese Unexamined Patent Application Publication No. 2011-60830, the dielectric constant of the gate insulating film is changed upon the gate insulating film being irradiated with light. Accordingly, a current flowing between a source and a drain is changed with the light irradiation of the gate insulating film. Japanese Unexamined Patent Application Publication No. 2011-60830 sets forth that the above-mentioned type of thin film transistor can be used as a photosensor.

SUMMARY

One non-limiting and exemplary embodiment provides an optical sensor with a novel configuration.

In one general aspect, the techniques disclosed here feature an optical sensor comprising: a semiconductor layer including a first region, a second region, and a third region between the first region and the second region; a first electrode facing to the semiconductor layer; a photoelectric conversion layer between the third region and the first electrode; and voltage supply circuitry that applies a predetermined voltage between the first electrode and the first region to apply a bias voltage to the photoelectric conversion layer, wherein the photoelectric conversion layer has a photocurrent characteristic showing how a current density of current flowing through the photoelectric conversion layer varies with the bias voltage applied to the photoelectric conversion layer, the photocurrent characteristic including a first voltage range where an absolute value of the current density increases as the bias voltage increases in a reverse direction, a second voltage range where the current density increases as the bias voltage increases in a forward direction, and a third voltage range where an absolute value of a rate of change of the current density relative to the bias voltage is less than in the first voltage range and the second voltage range, the third voltage range being between the first voltage range and the second voltage range, and the voltage supply circuitry applies the predetermined voltage between the first electrode and the first region such that the bias voltage falls within the third voltage range.

It should be noted that general or specific embodiments may be implemented as an element, a device, an apparatus, a system, an integrated circuit, or a method. It should be noted that general or specific embodiments may also be implemented as any selective combination of an element, a device, an apparatus, a system, an integrated circuit, and a method.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
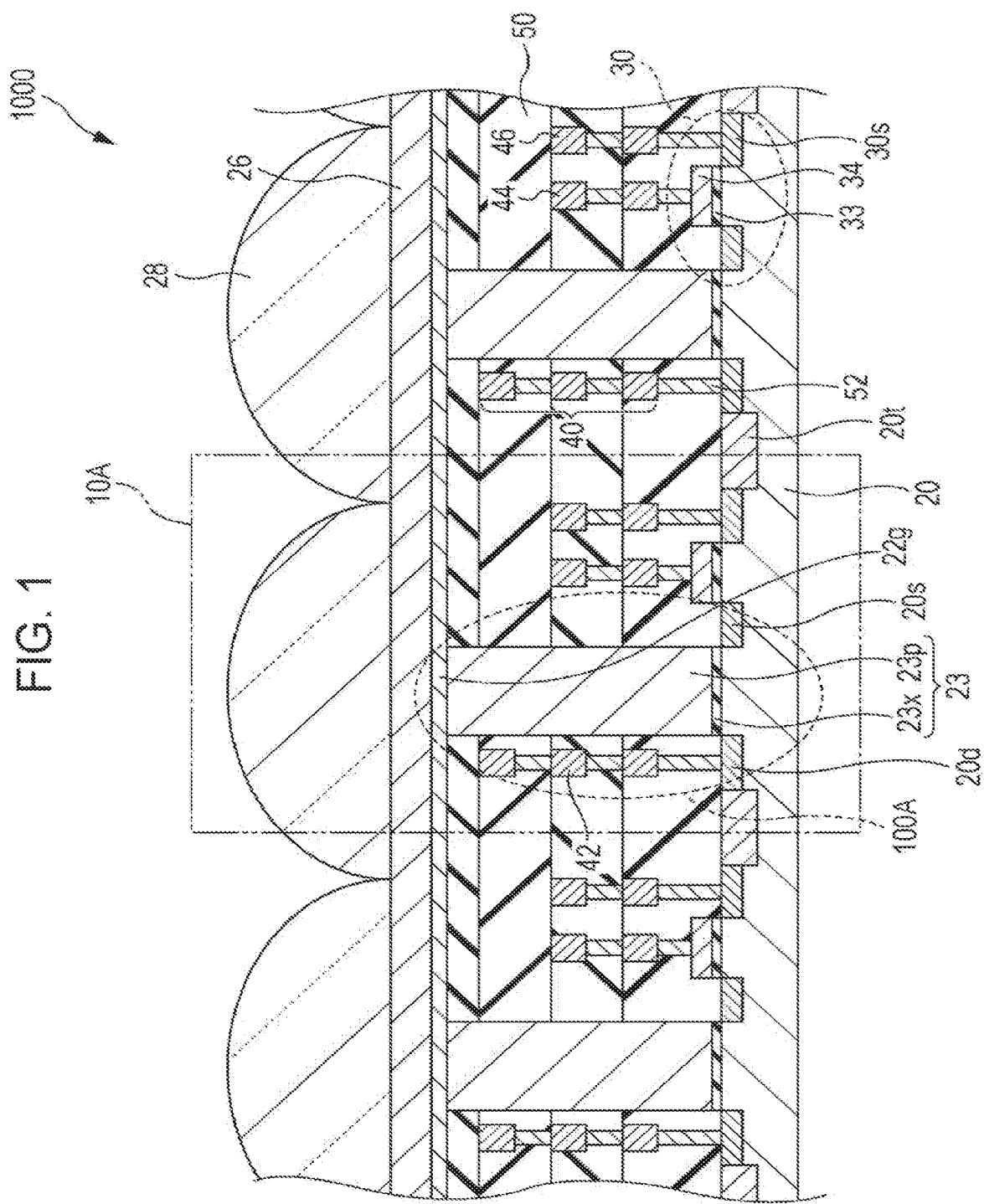
FIG. 1 is a schematic sectional view illustrating a section of an optical detection device according to a first embodiment of the present disclosure.

Embodiments of the present disclosure are summarized as follows.

Item 1

An optical sensor comprising:

a semiconductor layer including a first region, a second region, and a third region between the first region and the second region;

a gate electrode facing to the semiconductor layer;

a gate insulating layer between the third region and the gate electrode, the gate insulating layer including a photoelectric conversion layer;

a voltage supply circuit; and a signal detection circuit connected to the first region, wherein the photoelectric conversion layer has a photocurrent characteristic between a bias voltage applied to the photoelectric conversion layer and a current density of a current flowing through the photoelectric conversion layer, the photocurrent characteristic including a first voltage range where an absolute value of the current density increases as the bias voltage increases in a reverse direction, a second voltage range where the current density increases as the bias voltage increases in a forward direction, and a third voltage range where an absolute value of a rate of change of the current density relative to the bias voltage is less than in the first voltage range and the second voltage range, the third voltage range being between the first voltage range and the second voltage range, the voltage supply circuit applies a predetermined voltage between the gate electrode and the second region such that the bias voltage falls within the third voltage range, and the signal detection circuit detects an electrical signal corresponding to a change of a capacitance of the photoelectric conversion layer, the change being caused by incident light.

Item 2

The optical sensor according to Item 1, wherein the gate insulating layer includes a first insulating layer between the photoelectric conversion layer and the semiconductor layer.

Item 3

The optical sensor according to Item 1, further comprising a light-shielding film between the gate electrode and the semiconductor layer.

Item 4

An optical sensor comprising:

a first electrode;

a second electrode facing to the first electrode;

a photoelectric conversion layer between the first electrode and the second electrode;

a transistor having a gate, a source and a drain, the gate being electrically connected to the first electrode;

a voltage supply circuit; and a signal detection circuit connected to one of the source and the drain of the transistor, wherein the photoelectric conversion layer has a photocurrent characteristic between a bias voltage applied to the photoelectric conversion layer and an current density of a current flowing through the photoelectric conversion layer, the photocurrent characteristic including a first voltage range where an absolute value of the current density increases as the bias voltage increases in a reverse direction, a second voltage range where the current density increases as the bias voltage increases in a forward direction, and a third voltage range where an absolute value of a rate of change of the current density relative to the bias voltage is less than in the first voltage range and the second voltage range, the third voltage range being between the first voltage range and the second voltage range, the voltage supply circuit applies a predetermined voltage between the second electrode and the other of the source and the drain such that the bias voltage falls within the third voltage range, and the signal detection circuit detects an electrical signal corresponding to a change of a capacitance of the photoelectric conversion layer, the change being caused by incident light.

Item 5

The optical sensor according to Item 4, wherein the first electrode has a light-shielding property.

Item 6

The optical sensor according to Item 4, further comprising at least one of a first insulating layer and a second insulating layer, the first insulating layer being sandwiched between the first electrode and the photoelectric conversion layer, the second insulating layer being sandwiched between the second electrode and the photoelectric conversion layer.

Item 7

The optical sensor according to Item 1, wherein the third voltage range is −1 V or more and 1 V or less.

Item 8

The optical sensor according to Item 1, wherein the current density is 100 $\mu A/cm^2$ or less when the voltage supply circuit applies the voltage.

Item 9

An optical sensor including:

a semiconductor substrate that includes a source region and a drain region;

a gate insulating layer positioned on the semiconductor substrate; and a transparent gate electrode positioned on the gate insulating layer, wherein the gate insulating layer includes a photoelectric conversion layer, the photoelectric conversion layer has photocurrent characteristics including a first voltage range in which an absolute value of an output current density increases as a bias voltage in a reverse direction increases, a second voltage range in which the output current density increases as a bias voltage in a forward direction increases, and a third voltage range positioned between the first voltage range and the second voltage range, the photocurrent characteristics exhibiting different rates of change of the output current density with respect to the bias voltage from one another among the first voltage range, the second voltage range, and the third voltage range, the rate of change in the third voltage range is smaller than the rate of change in the first voltage range and the rate of change in the second voltage range, and in a state that a potential difference between one of the source region and the drain region and the transparent gate electrode is maintained within the third voltage range, light incident on the photoelectric conversion layer through the gate electrode is detected as an electrical signal obtained from the other of the source region and the drain region and corresponding to a change of a dielectric constant of the photoelectric conversion layer, the change being caused with incidence of the light.

With the features set forth in Item 9, an optical sensor having good responsivity can be provided. For example, an infrared sensor having good responsivity can be realized.

Item 10

The optical sensor according to Item 9, further including a voltage supply circuit that supplies a gate voltage to the transparent gate electrode, the gate voltage being within the third voltage range when a potential in the one of the source region and the drain region is regarded as a reference.

With the feature set forth in Item 10, a potential difference within the third voltage range can be applied between principal surfaces of the photoelectric conversion layer.

Item 11

The optical sensor according to Item 9 or 10, the gate insulating layer includes a first insulating layer that is arranged between the photoelectric conversion layer and the semiconductor substrate.

With the feature set forth in Item 11, a gate leak in the optical sensor can be suppressed.

Item 12

The optical sensor according to Item 11, further including an address transistor formed in and/or on the semiconductor substrate and having a source and a drain one of which is electrically connected to the other of the source region and the drain region, wherein a gate of the address transistor includes a second insulating layer, and the second insulating layer in the address transistor is positioned in the same layer as the first insulating layer.

With the features set forth in Item 12, the first insulating layer in the gate insulating layer and the second insulating layer in the gate of the address transistor can be formed together in the same step. Accordingly, an alignment margin needed in photolithography can be reduced.

Item 13

The optical sensor according to any one of Items 9 to 12, further including a light-shielding film that is arranged between the transparent gate electrode and the semiconductor substrate.

With the feature set forth in Item 13, since stray light can be suppressed from entering a channel region formed between the source region and the drain region, it is possible to suppress mixing of noise, such as color mixing between unit pixel cells adjacent to each other.

Item 14

An optical sensor including:

a semiconductor substrate;

a field effect transistor formed in and/or on the semiconductor substrate;

a first electrode connected to a gate of the field effect transistor;

a second electrode opposing to the first electrode and having a light-shielding property; and a photoelectric conversion layer arranged between the first electrode and the second electrode, wherein the photoelectric conversion layer has photocurrent characteristics including a first voltage range in which an absolute value of an output current density increases as a bias voltage in a reverse direction increases, a second voltage range in which the output current density increases as a bias voltage in a forward direction increases, and a third voltage range positioned between the first voltage range and the second voltage range, the photocurrent characteristics exhibiting different rates of change of the output current density with respect to the bias voltage from one another among the first voltage range, the second voltage range, and the third voltage range, the rate of change in the third voltage range is smaller than the rate of change in the first voltage range and the rate of change in the second voltage range, and in a state that a potential difference between one of a source and a drain of the field effect transistor and the second electrode is maintained within the third voltage range, light incident on the photoelectric conversion layer through the second electrode is detected as an electrical signal obtained from the other of the source region and the drain region and corresponding to a change of a dielectric constant of the photoelectric conversion layer, the change being caused with incidence of the light.

With the features set forth in Item 14, an optical sensor having good responsivity can be provided. For example, an infrared sensor having good responsivity can be realized.

Item 15

The optical sensor according to Item 14, further including a voltage supply circuit that supplies a voltage to the second electrode, the voltage being within the third voltage range when a potential in the one of the source and the drain is regarded as a reference.

With the feature set forth in Item 15, a potential difference within the third voltage range can be applied between principal surfaces of the photoelectric conversion layer.

Item 16

An optical sensor including:

a semiconductor substrate;

a field effect transistor formed in and/or on the semiconductor substrate;

a first electrode connected to a gate of the field effect transistor;

a second electrode opposing to the first electrode and having a light-shielding property;

a photoelectric conversion layer arranged between the first electrode and the second electrode; and at least one insulating layer that is arranged at least one of boundaries between the first electrode and the photoelectric conversion layer and between the photoelectric conversion layer and the second electrode, wherein the photoelectric conversion layer has photocurrent characteristics including a first voltage range in which an absolute value of an output current density increases as a bias voltage in a reverse direction increases, a second voltage range in which the output current density increases as a bias voltage in a forward direction increases, and a third voltage range positioned between the first voltage range and the second voltage range, the photocurrent characteristics exhibiting different rates of change of the output current density with respect to the bias voltage from one another among the first voltage range, the second voltage range, and the third voltage range, the rate of change in the third voltage range is smaller than the rate of change in the first voltage range and the rate of change in the second voltage range, and in a state that a potential difference between one of a source and a drain of the field effect transistor and the second electrode is maintained within the first voltage range, light incident on the photoelectric conversion layer through the second electrode is detected as an electrical signal obtained from the other of the source region and the drain region and corresponding to a change of a dielectric constant of the photoelectric conversion layer, the change being caused with incidence of the light.

With the features set forth in Item 16, an optical sensor capable of reading out an output signal at timing different from timing of exposure can be realized.

Item 17

The optical sensor according to Item 16, further including a voltage supply circuit that supplies a voltage to the second electrode, the voltage being within the first voltage range when a potential in the one of the source and the drain is regarded as a reference.

With the feature set forth in Item 17, a potential difference within the first voltage range can be applied between principal surfaces of the photoelectric conversion layer.

Item 18

The optical detection device according to any one of Items 14 to 17, wherein the first electrode is an electrode with a light-shielding property.

With the feature set forth in Item 18, since stray light can be suppressed from entering a channel region of the transistor, it is possible to suppress mixing of noise, such as color mixing between unit pixel cells adjacent to each other.

Item 19

The optical detection device according to any one of Items 14 to 18, wherein the gate of the field effect transistor includes a first gate insulating layer and a first gate electrode that are disposed on the semiconductor substrate, and the first electrode includes a connection portion that connects the first gate electrode and the first electrode to each other.

With the features set forth in Item 19, a degree of freedom in design of wirings arranged between the semiconductor substrate and the first electrode is increased.

Item 20

The optical sensor according to Item 19, further including an address transistor formed in and/or on the semiconductor substrate and having a source and a drain one of which is electrically connected to the other of the source and the drain of the field effect transistor, wherein a gate of the address transistor includes a second gate electrode, and the second gate electrode of the address transistor is positioned in the same layer as the first gate electrode.

With the features set forth in Item 20, the first gate electrode of the field effect transistor and the second gate electrode of the address transistor can be formed together in the same step. Accordingly, an alignment margin needed in photolithography can be reduced.

Item 21

The optical detection device according to Item 20, wherein the gate of the address transistor includes a second gate insulating layer, and the second gate insulating layer of the address transistor is positioned in the same layer as the first gate insulating layer.

With the features set forth in Item 21, since a gate structure in the field effect transistor and a gate structure in the address transistor can be made in common to each other, the first gate insulating layer of the field effect transistor and the second gate insulating layer of the address transistor can be formed together in the same step. Furthermore, the first gate electrode of the field effect transistor and the second gate electrode of the address transistor can be formed together in the same step. Accordingly, the manufacturing cost can be reduced.

Item 22

An optical sensor including:

a semiconductor substrate;

first and second field effect transistors formed in and/or on the semiconductor substrate;

a first electrode connected to a gate of the first field effect transistor;

a second electrode opposing to the first electrode and having a light-shielding property; and a photoelectric conversion layer arranged between the first electrode and the second electrode, wherein the gate of the first field effect transistor includes a first gate electrode, a gate of the second field effect transistor includes a second gate electrode that is arranged in the same layer as the first gate electrode, and one of a source and a drain of the second field effect transistor is electrically connected to one of a source and a drain of the first field effect transistor, and the first field effect transistor outputs, from one of the source and the drain, an electrical signal corresponding to a change of a dielectric constant of the photoelectric conversion layer, the change being caused with incidence of light through the second electrode.

With the features set forth in Item 22, the first gate electrode and the second gate electrode can be formed together in the same step. Accordingly, an alignment margin needed in photolithography can be reduced.

Item 23

The optical detection device according to Item 22, wherein the gate of the first field effect transistor includes a first gate insulating layer, and the gate of the second field effect transistor includes a second gate insulating layer that is positioned in the same layer as the first gate insulating layer.

With the features set forth in Item 23, since a gate structure in the first field effect transistor and a gate structure in the second field effect transistor can be made in common to each other, the first gate insulating layer and the second gate insulating layer can be formed together in the same step. Furthermore, the first gate electrode and the second gate electrode can be formed together in the same step. Accordingly, the manufacturing cost can be reduced.

Item 24

The optical sensor according to Item 22 or 23, further including at least one insulating layer that is arranged at least one of boundaries between the first electrode and the photoelectric conversion layer and between the photoelectric conversion layer and the second electrode.

With the feature set forth in Item 24, an optical sensor capable of reading out an output signal at timing different from timing of exposure can be realized.

Item 25

The optical sensor according to any one of Items 22 to 24, further including a plurality of unit pixel cells each including the first and second field effect transistors and the first electrode, wherein the second electrode and the photoelectric conversion layer are arranged to extend over the plurality of unit pixel cells.

With the features set forth in Item 25, even when the optical sensor includes the plurality of unit pixel cells, an alignment margin needed in forming the first and second gate insulating layers and an alignment margin needed in forming the first and second gate electrodes can be reduced. Thus, the features set forth in Item 25 are advantageous in further reducing sizes of fine pixels.

Embodiments of the present disclosure will be described in detail below with reference to the drawings. It is to be noted that any of the following embodiments represents a general or specific example. Thus, numerical values, shapes, materials, components, arrangements and connected forms of the components, steps, sequences of the steps, and so on, which are described in the following embodiments, are merely illustrative, and they are not purported to limit the present disclosure. The individual embodiments described in this specification can be combined with each other insofar as not causing contradictions. Among the components in the following embodiments, those ones other than the components not stated in an independent claim, which defines the most significant concept, are explained as being components that can be optionally used. In the following description, the components having substantially the same functions are denoted by common reference sings and description of those components is omitted in some cases.

First Embodiment of Optical Sensor

FIG. 1 schematically illustrates a section of an optical detection device according to a first embodiment of the present disclosure. An optical detection device 1000 illustrated in FIG. 1 includes a plurality of unit pixel cells 10A each including a photosensor 100A. The plurality of unit pixel cells 10A are arrayed in a matrix pattern, for example, and they form a photosensor array. FIG. 1 schematically illustrates respective sections of three unit pixel cells 10A, which are arranged in a row direction of the photosensor array, among the plurality of unit pixel cells 10A. It is to be noted that FIG. 1 merely schematically illustrates the layout of individual components constituting the optical detection device 1000, and that sizes of the components illustrated in FIG. 1 do not always exactly reflect the sizes in an actual device. Such a point is similarly applied to the other drawings in the present disclosure.

The unit pixel cells 10A are formed in and on a semiconductor substrate 20. In this embodiment, the semiconductor substrate 20 is, for example, a p-type silicon (Si) substrate. The unit pixel cells 10A are electrically isolated from each other by element isolation regions 20t that are formed in the semiconductor substrate 20. A distance (pixel pitch) between adjacent two of the unit pixel cells 10A may be about 2 μm, for example. The "semiconductor substrate" used in this specification is not limited to a substrate that is entirely a semiconductor layer, and it may be, for example, an insulating substrate including a semiconductor layer that is formed on a surface at the side irradiated with light.

The photosensor 100A in the unit pixel cell 10A has a device structure substantially similar to that of a field effect transistor (FET). In more detail, the photosensor 100A includes impurity regions (n-type regions in this embodiment) 20s and 20d that are both formed in the semiconductor substrate 20, a gate insulating layer 23 that is arranged on a region sandwiched between the impurity regions 20s and 20d both formed in the semiconductor substrate 20, and a transparent gate electrode 22g that is arranged on the gate insulating layer 23. As illustrated in FIG. 1, the transparent gate electrode 22g is arranged on an interlayer insulating layer 50 covering the semiconductor substrate 20.

In the configuration illustrated in FIG. 1, the interlayer insulating layer 50 has a multilayer structure including a plurality of insulating layers (typically, silicon oxide films). A multilayer wiring 40 is disposed in the interlayer insulating layer 50. The multilayer wiring 40 includes a plurality of wiring layers. In the configuration illustrated in FIG. 1, the multilayer wiring 40 includes three wiring layers. A power supply wiring line 42, an address signal line 44, and a vertical signal line 46 are disposed in middle one of the three wiring layers. The power supply wiring line 42, the address signal line 44, and the vertical signal line 46 extend, for example, along a direction perpendicular to the drawing sheet (i.e., in a column direction in the photosensor array). In the example illustrated in FIG. 1, the interlayer insulating layer 50 and the multilayer wiring 40 include four insulating layers and three wiring layers, respectively. However, the number of the insulating layers in the interlayer insulating layer 50 and the number of the wiring layers in the multilayer wiring 40 are not limited to the above-mentioned examples.

In the configuration illustrated in FIG. 1, the power supply wiring line 42 in the multilayer wiring 40 is connected to the impurity region 20d through a contact plug 52. As described later, a power supply for supplying a predetermined voltage is connected to the power supply wiring line 42. During the operation of the optical detection device 1000, a predetermined bias voltage (first bias voltage) is applied to the impurity region 20d through the power supply wiring line 42.

The gate insulating layer 23 penetrates through the interlayer insulating layer 50 and interconnects an upper surface of the semiconductor substrate 20 and a lower surface of the transparent gate electrode 22g. It is to be noted that the words "upper surface" and "lower surface" in this specification are used to represent a relative positional relation in arrangement of members and are not intended to limit a posture of the optical detection device according to the present disclosure.

The gate insulating layer 23 includes a photoelectric conversion layer 23p. A thickness of the photoelectric conversion layer 23p (i.e., a length measured along a normal direction of the semiconductor substrate 20) is about 1500 nm, for example. Details of a typical example of configuration of the photoelectric conversion layer 23p will be described later. In the configuration illustrated in FIG. 1, an insulating layer 23x is disposed between the photoelectric conversion layer 23p and the semiconductor substrate 20. The insulating layer 23x may be in contact with the semiconductor substrate 20.

In the example illustrated in FIG. 1, the transparent gate electrode 22g on the interlayer insulating layer 50 is formed to extend over the plurality of unit pixel cells 10A. The transparent gate electrode 22g is connected to the power supply (not illustrated). Similarly to the impurity region 20d in the semiconductor substrate 20, the transparent gate electrode 22g is constituted such that, during the operation of the optical detection device 1000, a predetermined bias voltage (second bias voltage) can be applied to the transparent gate electrode 22g.

During the operation of the optical detection device 1000, because the predetermined voltages are applied respectively to the transparent gate electrode 22g and the impurity region 20d, a potential difference between the transparent gate electrode 22g and the impurity region 20d is maintained constant. Insofar as the potential difference between the transparent gate electrode 22g and the impurity region 20d can be maintained constant during the operation, it is not always needed that the transparent gate electrode 22g is formed to extend over the plurality of unit pixel cells 10A. In another example, the transparent gate electrode 22g may be formed in a state separated for each of the unit pixel cells 10A.

As described in detail later, in an operation of detecting light, the light is applied to the optical detection device 1000 from one side of the photosensor 100A, the side including the transparent gate electrode 22g, (i.e., from the upper side in FIG. 1) in the state where the potential difference between the transparent gate electrode 22g and the impurity region 20d is maintained constant. The light applied to the optical detection device 1000 enters the photoelectric conversion layer 23p of the gate insulating layer 23 through the transparent gate electrode 22g. Upon irradiation with the incident light, the photoelectric conversion layer 23p generates electron-hole pairs. The dielectric constant of the photoelectric conversion layer 23p is changed with the generation of electron-hole pairs in the photoelectric conversion layer 23p. Assuming the photosensor 100A to be a field effect transistor, a change of the dielectric constant of the photoelectric conversion layer 23p provides a similar effect to that obtained when a gate capacitance of the field effect transistor is changed. In other words, the magnitude of a current flowing between the impurity regions 20s and 20d is changed with the light irradiation of the gate insulating layer 23. The light can be detected by utilizing the change of the current.

In view of the above-described principle of operation, the photosensor 100A may be called a capacitance-modulated transistor. The impurity regions 20s and 20d correspond to, for example, a source region and a drain region of the capacitance-modulated transistor, respectively. In the following description, the impurity region 20s is called a source region (or a drain region) of the photosensor, and the impurity region 20d is called a drain region (or a source region) of the photosensor in some cases. Moreover, in the following description, a current flowing between the impurity regions 20s and 20d is simply called a drain current for the sake of simplicity in some cases.

In the example illustrated in FIG. 1, an infrared transmission filter 26 selectively allowing infrared rays to transmit therethrough is disposed on the transparent gate electrode 22g. In other words, FIG. 1 illustrates the configuration of the optical detection device 1000 when the optical detection device 1000 is utilized as an infrared detection device. Thus, the light detected by the optical detection device 1000 is not limited to light within the wavelength range of visible light (e.g., 380 nm or more to 780 nm or less). In this specification, overall electromagnetic waves including infrared rays and ultraviolet rays are expressed by "light" for the sake of convenience. The word "transparent" used in this specification stands for the property of allowing transmission of at least part of light in a wavelength range to be detected, and it is not essential to allow transmission of light in the entire wavelength range of visible light.

When the optical detection device 1000 is utilized as an infrared detection device, a transparent conducting oxide (TCO) having a high transmittance for near infrared rays and a small resistance value is used as a material of the transparent gate electrode 22g. For example, ITO, IZO, AZO, FTO, $SnO_2$, $TiO_2$, or $ZnO_2$ can be used as TCO. Alternatively, a metal thin film made of Au, for example, may be used as the transparent gate electrode 22g. As illustrated in FIG. 1, a microlens 28 for condensing the irradiation light to be incident upon the photoelectric conversion layer 23p may be arranged on the infrared transmission filter 26. A protective layer may be arranged between the microlens 28 and the transparent gate electrode 22g.

In the configuration illustrated in FIG. 1, each unit pixel cell 10A includes an address transistor 30. The address transistor 30 includes the impurity region 20s and an impurity region 30s both formed in the semiconductor substrate 20, a gate insulating layer 33, and a gate electrode 34. The gate insulating layer 33 is, for example, a thermal oxide film of silicon (i.e., a silicon dioxide film). The gate electrode 34 is, for example, a polysilicon electrode. In the illustrated example, the address transistor 30 and the photosensor 100A share the impurity region 20s. By sharing the impurity region 20s, the address transistor 30 and the photosensor 100A are electrically connected to each other.

The impurity region 20s in the address transistor 30 functions, for example, as a drain region of the address transistor 30. The impurity region 30s in the address transistor 30 functions, for example, as a source region of the address transistor 30. The gate electrode 34 (typically a polysilicon electrode) of the address transistor 30 is connected to the address signal line 44 of the multilayer wiring 40 through the contact plug 52. The impurity region 30s of the address transistor 30 is connected to the vertical signal line 46 of the multilayer wiring 40 through the contact plug 52. Accordingly, a signal generated by the photosensor 100A can be selectively read out through the vertical signal line 46 by controlling a potential of the gate electrode 34 through the address signal line 44 so as to turn on the address transistor 30.

The above-mentioned multilayer wiring 40 including the vertical signal line 46, etc. as part thereof is formed of a metal such as copper, for example. A light-shielding film may be formed by one wiring layer in the multilayer wiring 40. By causing one wiring layer arranged within the interlayer insulating layer 50 to function as a light-shielding film, part of the light having transmitted through the transparent gate electrode 22g, the part having not entered the photoelectric conversion layer 23p, can be blocked by the light-shielding wiring layer. As a result, the light (infrared rays in this embodiment) having not entered the photoelectric conversion layer 23p can be suppressed from entering a channel region of a transistor (e.g., the capacitance-modulated transistor or the address transistor 30) that is formed in and on the semiconductor substrate 20. The insulating layer 23x and/or the gate insulating layer 33 may have a light-shielding property. By suppressing incidence of stray light upon the channel region, it is possible to suppress mixing of noise, such as color mixing between the unit pixel cells adjacent to each other. Of the light having transmitted through the transparent gate electrode 22g, most part going toward the photoelectric conversion layer 23p is absorbed by the photoelectric conversion layer 23p. Therefore, the light going toward the photoelectric conversion layer 23p does not adversely affect the operation of the transistor formed in and on the semiconductor substrate 20.

Exemplary Circuit Configuration of Optical Detection Device

Figure 2:
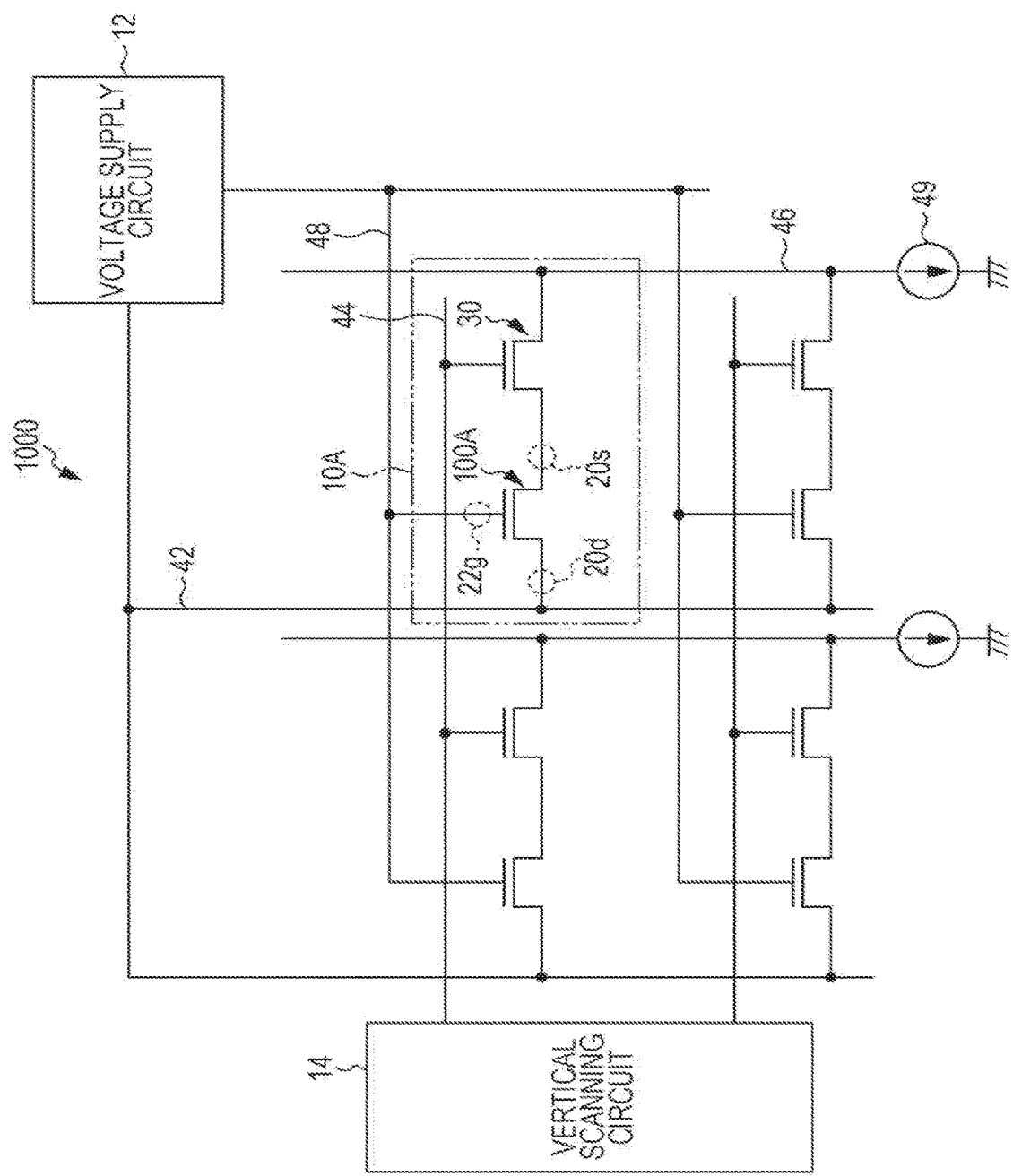
FIG. 2 is a schematic view illustrating an exemplary circuit configuration of the optical detection device.

FIG. 2 illustrates an exemplary circuit configuration of the optical detection device 1000. As described above, the photosensor 100A has a similar device structure to that of a field effect transistor. For that reason, the photosensor 100A is conveniently expressed here using similar circuit symbols to those used for a transistor.

FIG. 2 schematically illustrates an example in which the unit pixel cells 10A are arrayed in a matrix pattern of two rows and two columns. In this specification, directions in which a row and a column extend are called respectively a row direction and a column direction in some cases. As a matter of course, the number and the layout of the unit pixel cells in the optical detection device 1000 are not limited to those illustrated in the example of FIG. 2. The unit pixel cells may be arrayed one-dimensionally. In such a case, the optical detection device 1000 serves as a line sensor. The number of the unit pixel cells included in the optical detection device 1000 may be two or more, or may be one.

As described before, the impurity region 20d (which may be called the drain of the capacitance-modulated transistor) in the photosensor 100A of each unit pixel cell 10A is connected to the power supply wiring line 42. In the example illustrated in FIG. 2, the power supply wiring lines 42 are arranged in a one-to-one relation to the columns of the photosensor array. Those power supply wiring lines 42 are connected to a voltage supply circuit 12. During the operation of the optical detection device 1000, the voltage supply circuit 12 supplies the predetermined voltage (first bias voltage) to each of the unit pixel cells 10A, which constitute the photosensor array, through the power supply wiring line 42.

The transparent gate electrode 22g in the photosensor 100A of each unit pixel cell 10A is connected to a gate voltage control line 48. In the configuration illustrated in FIG. 2, the gate voltage control line 48 is connected to the voltage supply circuit 12. Thus, during the operation of the optical detection device 1000, the predetermined gate voltage (second bias voltage) is applied to the transparent gate electrode 22g of each photosensor 100A in the photosensor array from the voltage supply circuit 12 through the gate voltage control line 48. The voltage supply circuit 12 is not limited to a particular power supply circuit, and it may be a circuit for generating a predetermined voltage, or a circuit for converting a voltage supplied from another power supply to a predetermined voltage. As described later, the gate voltage within a predetermined range with a potential in the impurity region 20d of the photosensor 100A being a reference is applied to the transparent gate electrode 22g of each photosensor 100A.

In the configuration illustrated in FIG. 2, the address signal line 44 connected to the gate of the address transistor 30 is connected to a vertical scanning circuit (also called a "row scanning circuit") 14. The vertical scanning circuit 14 applies a predetermined voltage to the address signal line 44, thereby selecting the plurality of unit pixel cells 10A, which are arranged in each row, in units of row. Thus, signals of the selected unit pixel cells 10A can be read out through the address transistor 30.

As illustrated in the drawing, one (typically the drain) of the source and the drain of the address transistor 30 is connected to the impurity region 20s (which may also be called the source of the capacitance-modulated transistor) in the photosensor 100A, and the other (the source in this embodiment) of the source and the drain of the address transistor 30 is connected to the vertical signal line 46 that is disposed for each column of the photosensor array. The vertical signal line 46 is a main signal line through which pixel signals are transmitted from the photosensor array to a peripheral circuit.

In the illustrated example, a constant-current source 49 is connected between the vertical signal line 46 and a ground. Accordingly, a change of the drain current in the photosensor 100A, the change being attributable to the light irradiation of the photosensor 100A, can be detected by detecting a voltage change in the vertical signal line 46. Stated in another way, the light can be detected in accordance with the voltage change in the vertical signal line 46. On that occasion, the power supply wiring line 42 functions as a source follower power supply. The light may be detected by detecting a current that is output from the impurity region 20s of the photosensor 100A. However, it is more advantageous to detect the voltage change from the viewpoint that a similar process and circuit to those utilized for a photosensor using a silicon photodiode can be applied, and that a higher S/N ratio can be obtained.

A circuit for supplying the predetermined voltage to the impurity region 20d in the photosensor 100A and a circuit for supplying the predetermined voltage to the transparent gate electrode 22g may be one common circuit as illustrated in FIG. 2, or may be different from each other. At least one of the circuit for supplying the predetermined voltage to the impurity region 20d in the photosensor 100A and the circuit for supplying the predetermined voltage to the transparent gate electrode 22g may be part of the vertical scanning circuit 14.

Photoelectric Conversion Layer

A typical example of configuration of the photoelectric conversion layer 23p will be described in detail below.

A semiconductor material is typically used to constitute the photoelectric conversion layer 23p. Upon receiving the irradiation light, the photoelectric conversion layer 23p generates electron-hole pairs therein. In this embodiment, an organic semiconductor material is used to constitute the photoelectric conversion layer 23p. The photoelectric conversion layer 23p contains, for example, tin naphthalocyanine expressed by the following general formula (1) (hereinafter simply called "tin naphthalocyanine" in some cases).

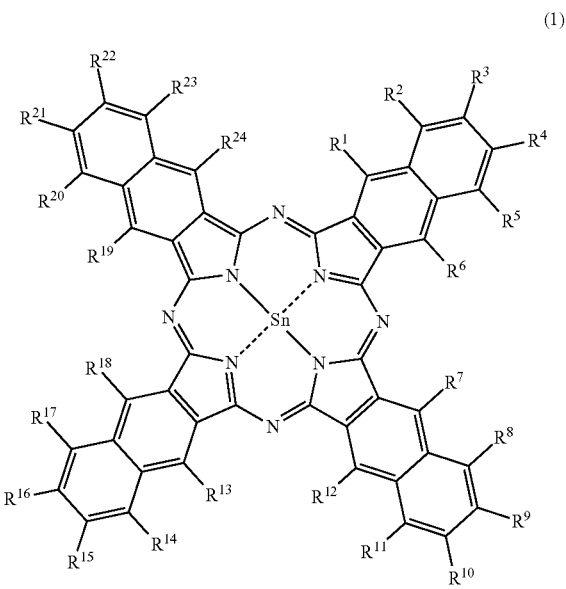

(1)

In the above general formula (1), $R^1$ to $R^{24}$ denote hydrogen atoms or substituents independently of one another. The substituents are not limited to particular ones. The substituents may be a deuterium atom, a halogen atom, alkyl groups (including a cycloalkyl group, a bicycloalkyl group, and a tricycloalkyl group), alkenyl groups (including a cycloalkenyl group and a bicycloalkenyl group), an alkynyl group, an aryl group, a heterocyclic group (also called a heterocyclic ring group), a cyano group, a hydroxy group, a nitro group, a carboxy group, an alkoxy group, an aryloxy group, a silyloxy group, a heterocyclic oxy group, an acyloxy group, a carbamoyloxy group, an alkoxycarbonyloxy group, an aryloxy carbonyloxy group, amino groups (including an anilino group), an ammonio group, an acylamino group, an aminocarbonyl amino group, an alkoxycarbonyl amino group, an aryloxycarbonyl amino group, a sulfamoylamino group, an alkylsulfonyl amino group, an arylsulfonyl amino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxy carbonyl group, an alkoxycarbonyl group, a carbamoyl group, an arylazo group, a heterocyclic azo group, an imide group, a phosphino group, a phosphinyl group, a phosphinyloxy group, a phosphinylamino group, a phosphono group, a silyl group, a hydrazino group, a ureido group, a borate group (—B(OH)$_2$), a phosfato group (—OPO(OH)$_2$), a sulfato group (—OSO$_3$H), and other known substituents.

The tin naphthalocyanine expressed by the above general formula (1) may be a commercially available product. Alternatively, the tin naphthalocyanine expressed by the above general formula (1) can be synthesized using, as a starting material, a naphthalene derivative that is expressed by the following general formula (2), as set forth in Japanese Unexamined Patent Application Publication No. 2010-232410, for example. $R^{25}$ to $R^{30}$ in the general formula (2) may be substituents similar to those used as $R^1$ to $R^{24}$ in the general formula (1).

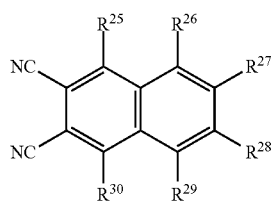

(2)

In the tin naphthalocyanine expressed by the above general formula (1), it is desirable, from the viewpoint of easiness in control of a molecular aggregation state, that eight or more among $R^1$ to $R^{24}$ are hydrogen atoms or deuterium atoms. More desirably, sixteen or more among $R^1$ to $R^{24}$ are hydrogen atoms or deuterium atoms. Even more desirably, all of $R^1$ to $R^{24}$ are hydrogen atoms or deuterium atoms. Additionally, tin naphthalocyanine expressed by the following general formula (3) is advantageous from the viewpoint of easiness in synthesis.

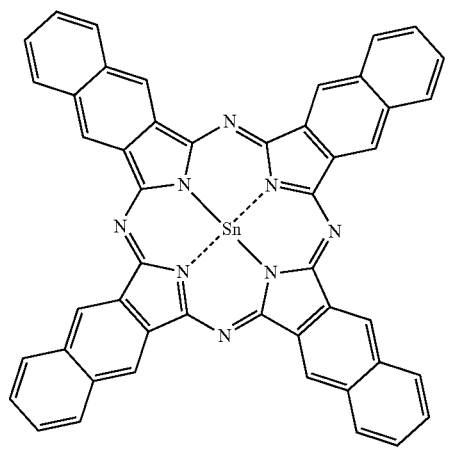

(3)

Figure 3:
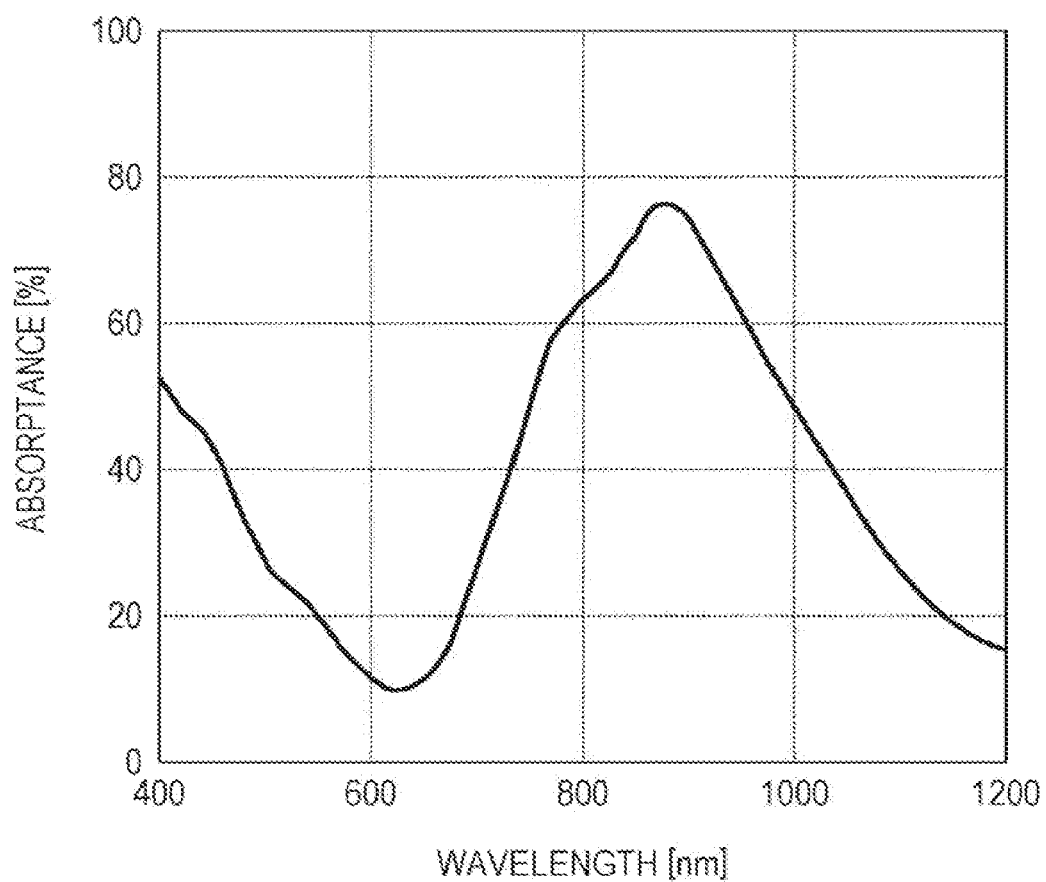
FIG. 3 is a graph depicting one example of an absorption spectrum in a photoelectric conversion layer that is formed of a material containing tin naphthalocyanine.

The tin naphthalocyanine expressed by the above general formula (1) exhibits absorption in a wavelength band of about 200 nm or more and about 1100 nm or less. The tin naphthalocyanine expressed by the above general formula (3), for example, has an absorption peak at the wavelength of about 870 nm as depicted in FIG. 3. FIG. 3 depicts one example of an absorption spectrum of a photoelectric conversion layer containing the tin naphthalocyanine expressed by the above general formula (3). A sample including the photoelectric conversion layer (thickness: 30 nm) laminated on a quartz substrate is used in measurement of the absorption spectrum.

As seen from FIG. 3, the photoelectric conversion layer formed of a material containing the tin naphthalocyanine exhibits absorption in a near-infrared region. In other words, an optical sensor capable of detecting near-infrared rays can be realized by selecting, as a material constituting the photoelectric conversion layer 23p, a material containing the tin naphthalocyanine.

Figure 4:
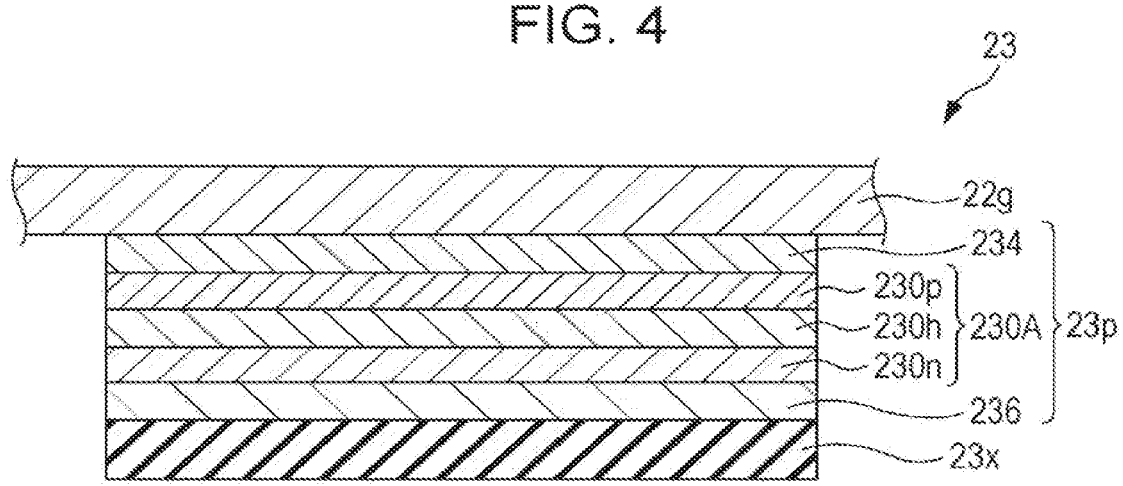
FIG. 4 is a schematic sectional view illustrating an example of a gate insulating layer including a photoelectric conversion layer that is formed of an organic semiconductor material containing tin naphthalocyanine expressed by a general formula (1)

FIG. 4 illustrates one example of the gate insulating layer including the photoelectric conversion layer that is formed using an organic semiconductor layer containing the tin naphthalocyanine expressed by the above general formula (1). In a configuration illustrated in FIG. 4, the gate insulating layer 23 includes a photoelectric conversion structure 230A. The gate insulating layer 23 further includes an electron blocking layer 234 that is disposed between the photoelectric conversion structure 230A and the transparent gate electrode 22g, and a hole blocking layer 236 that is disposed between the photoelectric conversion structure 230A and the insulating layer 23x.

The photoelectric conversion structure 230A includes at least one of a p-type semiconductor and an n-type semiconductor. In the configuration illustrated in FIG. 4, the photoelectric conversion structure 230A includes a p-type semiconductor layer 230p, an n-type semiconductor layer 230n, and a photoelectric conversion layer 230h sandwiched between the p-type semiconductor layer 230p and the n-type semiconductor layer 230n. The p-type semiconductor layer 230p is disposed between the electron blocking layer 234 and the photoelectric conversion layer 230h, and it has the functions of a photoelectric conversion layer and/or a hole transport layer. The n-type semiconductor layer 230n is disposed between the hole blocking layer 236 and the photoelectric conversion layer 230h, and it has the functions of a photoelectric conversion and/or an electron transport layer. As described later, the photoelectric conversion layer 230h may include at least one of a p-type semiconductor and an n-type semiconductor.

The p-type semiconductor layer 230p includes an organic p-type semiconductor, and the n-type semiconductor layer 230n includes an organic n-type semiconductor. Stated in another way, the photoelectric conversion structure 230A includes an organic photoelectric conversion material containing the tin naphthalocyanine expressed by the above general formula (1), and at least one of an organic p-type semiconductor and an organic n-type semiconductor.

The organic p-type semiconductor (compound) implies a donor organic semiconductor (compound), i.e., an organic compound that has electron-donating properties, and that is mainly represented by a hole transport organic compound. More specifically, when two organic materials are used in a contact state, one of those two organic compounds, which exhibits a smaller ionization potential, is called the organic p-type semiconductor (compound). Thus, any type of organic compound can be used as the donor organic compound insofar as it is an organic compound with electron-donating properties. Examples of that type of organic compound include a triarylamine compound, a benzidine compound, a pyrazoline compound, a styryl amine compound, a hydrazone compound, a triphenylmethane compound, a carbazole compound, a polysilane compound, a thiophene compound, a phthalocyanine compound, a cyanine compound, a merocyanine compound, an oxonol compound, a polyamine compound, an indole compound, a pyrrole compound, a pyrazole compound, a polyarylene compound, condensed aromatic carboncyclic compounds (such as a naphthalene derivative, an anthracene derivative, a phenanthrene derivative, a tetracene derivative, a pyrene derivative, a perylene derivative, and a fluoranthene derivative), and a metal complex having a nitrogen-containing heterocyclic compound as a ligand. The donor organic semiconductor is not limited to the above-mentioned examples. As described above, the donor organic semiconductor may be any type of organic compound having a smaller ionization potential than an organic compound that is used as the n-type (acceptor) compound. The above-mentioned tin naphthalocyanine is one example of the organic p-type semiconductor material.

The organic n-type semiconductor (compound) implies an acceptor organic semiconductor (compound), i.e., an organic compound that has electron-accepting properties, and that is mainly represented by an electron transport organic compound. More specifically, when two organic materials are used in a contact state, one of those two organic compounds, which exhibits a larger electron affinity, is called the organic n-type semiconductor (compound). Thus, any type of organic compound can be used as the acceptor organic compound insofar as it is an organic compound with electron-accepting properties. Examples of that type of organic compound include fullerene, a fullerene derivative, condensed aromatic carboncyclic compounds (such as a naphthalene derivative, an anthracene derivative, a phenanthrene derivative, a tetracene derivative, a pyrene derivative, a perylene derivative, and a fluoranthene derivative), five- to seven-membered heterocyclic compounds containing a nitrogen atom, an oxygen atom, and a sulfur atom (such as pyridine, pyradine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyrrolopyridine, thiadiazolopyridine, dibenzazepine, and tribenzazepine), a polyarylene compound, a fluorene compound, a cyclopentadiene compound, a silyl compound, and a metal complex having a nitrogen-containing heterocyclic compound as a ligand. The acceptor organic semiconductor is not limited to the above-mentioned examples. As described above, the acceptor organic semiconductor may be any type of organic compound having a larger electron affinity than an organic compound that is used as the p-type (donor) organic compound.

The photoelectric conversion layer 230h may be, for example, a bulk heterojunction structure layer including a p-type semiconductor and an n-type semiconductor. When the photoelectric conversion layer 230h is formed as a layer having the bulk heterojunction structure, the tin naphthalocyanine expressed by the above general formula (1) can be used as the p-type semiconductor material. Fullerene and/or a fullerene derivative, for example, can be used as the n-type semiconductor material. It is desirable that the material constituting the p-type semiconductor layer 230p is the same as the p-type semiconductor material contained in the photoelectric conversion layer 230h. Similarly, it is desirable that the material constituting the n-type semiconductor layer 230n is the same as the n-type semiconductor material contained in the photoelectric conversion layer 230h. The bulk heterojunction structure is described in detail in Japanese Patent No. 5553727. For reference, the entire contents of Japanese Patent No. 5553727 are assumed to be incorporated in this specification.

A photosensor having sensitivity in a desired wavelength range can be realized by employing a proper material depending on the wavelength range to be detected. The photoelectric conversion layer 23p may include an inorganic semiconductor material, such as amorphous silicon. The photoelectric conversion layer 23p may include a layer made of an organic material and a layer made of an inorganic material. The following description is made in connection with an example in which the bulk heterojunction structure obtained by co-evaporation of the tin naphthalocyanine and $C_{60}$ is employed in the photoelectric conversion layer 23p.

Photocurrent Characteristics in Photoelectric Conversion Layer

Figure 5:
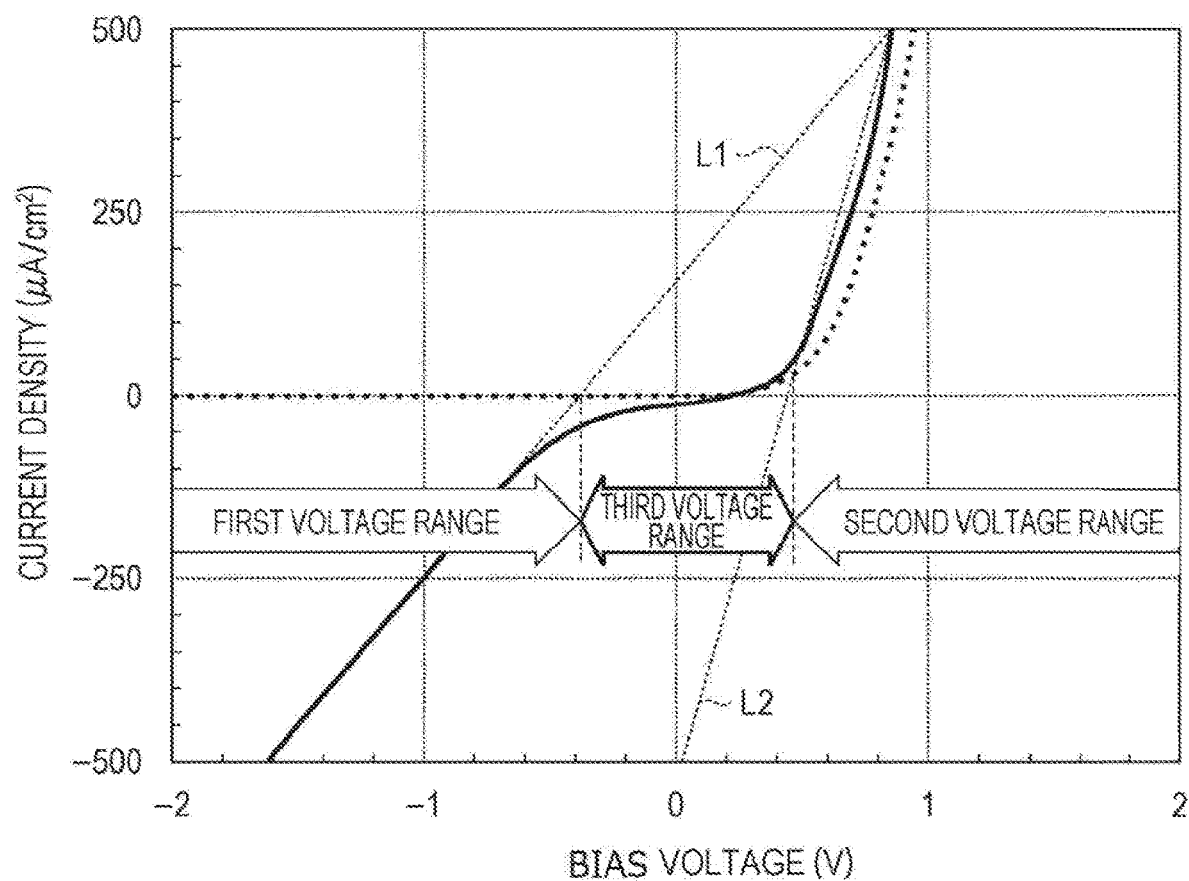
FIG. 5 is a graph depicting a typical example of photocurrent characteristics in the photoelectric conversion layer.

FIG. 5 depicts a typical example of photocurrent characteristics in the photoelectric conversion layer 23p. In FIG. 5, a graph denoted by a thick solid line represents, by way of example, current-voltage characteristics (I-V characteristics) of the photoelectric conversion layer 23p in a state where the photoelectric conversion layer is irradiated with light. One example of I-V characteristics in a state where the photoelectric conversion layer is not irradiated with light is also represented by a thick dotted line in FIG. 5.

FIG. 5 depicts changes of a current density between two principal surfaces of the photoelectric conversion layer when a bias voltage applied to those two principal surfaces is changed under constant illuminance. In this specification, a forward direction and a reverse direction of the bias voltage are defined as follows. When the photoelectric conversion layer has a junction structure made up of a p-type semiconductor in the form of a layer and an n-type semiconductor in the form of a layer, a bias voltage providing a higher potential in the layer of the p-type semiconductor than in the layer of the n-type semiconductor is defined as the bias voltage in the forward direction. On the other hand, a bias voltage providing a lower potential in the layer of the p-type semiconductor than in the layer of the n-type semiconductor is defined as the bias voltage in the reverse direction. In the case of employing organic semiconductor materials, the forward direction and the reverse direction can be defined as in the case of employing inorganic semiconductor materials. When the photoelectric conversion layer has the bulk heterojunction structure, as schematically illustrated in FIG. 1 in the above-cited Japanese Patent No. 5553727, the p-type semiconductor appears in one of the two principal surfaces of the photoelectric conversion layer at a larger proportion than the n-type semiconductor, and the n-type semiconductor appears in the other principal surface of the photoelectric conversion layer at a larger proportion than the p-type semiconductor. Accordingly, a bias voltage providing a potential on the side near the principal surface where the p-type semiconductor appears at a larger proportion than the n-type semiconductor, the potential being higher than that on the side near the principal surface where the n-type semiconductor appears at a larger proportion than the p-type semiconductor, is defined as the bias voltage in the forward direction.

As depicted in FIG. 5, the photocurrent characteristics in the photoelectric conversion layer according to the embodiment of the present disclosure are roughly featured by three, i.e., first to third, voltage ranges. The first voltage range represents a reverse-bias voltage range where an absolute value of an output current density increases as the bias voltage in the reverse direction increases. Thus, the first voltage range may be called a voltage range where a photocurrent increases as the bias voltage applied between the principal surfaces of the photoelectric conversion layer increases. The second voltage range represents a forward-bias voltage range where the output current density increases as the bias voltage in the forward direction increases. Thus, the second voltage range is a voltage range where a current in the forward direction increases as the bias voltage applied between the principal surfaces of the photoelectric conversion layer increases. The third voltage range is a voltage range between the first voltage range and the second voltage range.

The first to third voltage ranges can be discriminated in accordance with a gradient of the graph representing the photocurrent characteristics when the vertical axis and the horizontal axis are each expressed in a linear scale. For reference, in FIG. 5, an average gradient of the graph in the first voltage range is denoted by a dotted line L1, and an average gradient of the graph in the second voltage range is denoted by a dotted line L2. As depicted in FIG. 5, by way of example, a rate of change of the output current density relative to an increase of the bias voltage is different among the first voltage range, the second voltage range, and the third voltage range. The third voltage range is defined as a voltage range where the rate of change of the absolute value of the output current density relative to the bias voltage is smaller than the rate of change in the first voltage range and the rate of change in the second voltage range. As an alternative, the third voltage range may be determined on the basis of a position of rising (falling) in the graph that represents the I-V characteristics. Typically, the third voltage range is entirely larger than −1 V and entirely smaller than +1 V. In the third voltage range, the current density between the principal surfaces of the photoelectric conversion layer is hardly changed even when the bias voltage is changed. As depicted in FIG. 5, by way of example, the absolute value of the current density in the third voltage range is typically not more than 100 μA/cm². In the third voltage range, as described in detail later, the hole-electron pairs generated with the light irradiation promptly recombine and disappear upon stop of the light irradiation. Therefore, a high-speed response can be realized by adjusting the bias voltage, which is applied between the two principal surfaces of the photoelectric conversion layer during the operation of the optical detection device, to the voltage within the third voltage range.

Referring to FIGS. 1 and 2 again, in the typical embodiment of the present disclosure, the detection of the light is performed in a state where a potential difference between one of the two impurity regions of the photosensor, the one being connected to the power supply wiring line 42, and the transparent gate electrode 22g is maintained within the above-mentioned third voltage range during the operation of the optical detection device. In the configuration described with reference to FIG. 2, by way of example, the gate voltage with the impurity region 20d being a reference falling within the third voltage range is supplied to the transparent gate electrode 22g from the voltage supply circuit 12. In the operation of detecting the light, therefore, the photoelectric conversion layer 23p is in a state where the bias voltage within the third voltage range is applied between its upper surface (i.e., a principal surface on the side close to the transparent gate electrode 22g) and its lower surface.

With incidence of the light upon the photoelectric conversion layer 23p, hole-electron pairs are generated inside the photoelectric conversion layer 23p. At that time, because the predetermined bias voltage is applied to the photoelectric conversion layer 23p, respective dipole moments of the hole-electron pairs are oriented almost uniformly in the same direction. Therefore, the dielectric constant of the photoelectric conversion layer 23p increases with the generation of the hole-electron pairs. On an assumption that E denotes the magnitude of an electric field within the photoelectric conversion layer 23p in a state applied with the predetermined bias voltage and is irradiated with the light, $E=((\sigma_f-\sigma_p)/\varepsilon_0)$ and $E=((\sigma_f/\varepsilon))$ are held on the basis of Gauss's law. Here, $\sigma_f$ denotes a charge density in an electrode (e.g., the transparent gate electrode 22g), and $\sigma_p$ denotes a density of charges generated due to polarization in a surface of the photoelectric conversion layer 23p, the surface being opposed to the electrode. Furthermore, $\varepsilon_0$ and $\varepsilon$ denote respectively the dielectric constant of vacuum and the dielectric constant of the photoelectric conversion layer 23p. From $E=((\sigma_f-\sigma_p)/\varepsilon_0)$ and $E=(\sigma_f/\varepsilon)$, $\varepsilon=\varepsilon_0\,(\sigma_f/(\sigma_f-\sigma_p))$ is obtained. Thus, it is understood that the dielectric constant of the photoelectric conversion layer 23p increases with an increase of charges (hole-electron pairs) that contribute to the polarization. In other words, the overall dielectric constant of the gate insulating layer 23 increases with the light irradiation of the photoelectric conversion layer 23p.

Assuming here the photosensor 100A to be a transistor, with an increase of the dielectric constant of the gate insulating layer 23, a threshold voltage is reduced (this can also be said that an effective gate voltage is increased). Thus, the magnitude of a drain current flowing between the impurity regions 20d and 20s is changed due to a change of the dielectric constant of the gate insulating layer 23. Stated in another way, the magnitude of the drain current in the photosensor 100A is changed depending on a change of the illuminance applied to the photosensor 100A. Accordingly, the light can be detected by detecting the change of the magnitude of the drain current with an appropriate detection circuit.

By connecting the constant-current source 49 to the vertical signal line 46 as illustrated in FIG. 2, for example, and by turning on the address transistor 30, the change of the threshold voltage depending on the change of the illuminance applied to the photosensor 100A can be detected as a voltage change in the vertical signal line 46. Alternatively, a constant-voltage source may be connected to the vertical signal line 46, and a current change in the vertical signal line 46 may be detected. Thus, an output signal from the photosensor 100A may be given as a voltage change or a current change.

A point to be noted here is that the bias voltage within the third voltage range is applied to the photoelectric conversion layer 23p during the detection of the light. In a related-art photosensor utilizing a photodiode (or a photoelectric conversion film), an operation of detecting light is generally performed under application of a reverse bias, which corresponds to the first voltage range illustrated in FIG. 5. Therefore, holes and electrons generated with the photoelectric conversion drift respectively toward a cathode and an anode of the photodiode. Thus, in the detection of the light by the related-art photosensor utilizing the photodiode (or the photoelectric conversion film), charges generated with the photoelectric conversion are taken out as a signal to an external circuit.

On the other hand, in the typical example of the optical detection device according to the present disclosure, the bias voltage within the third voltage range is applied to the photoelectric conversion layer 23p during the detection of the light. When the photoelectric conversion layer 23p is irradiated with the light in the state where the bias voltage within the third voltage range is applied, hole-electron pairs are generated in the photoelectric conversion layer 23p. In the state where the bias voltage within the third voltage range is applied, however, the generated holes and electrons form dipoles without separating from each other and drifting to the electrodes. In other words, the generated holes and electrons are not taken out to the outside of the photoelectric conversion layer 23p.

Respective speeds of outflow of charges from the photoelectric conversion layer and inflow of charges into the photoelectric conversion layer are slow (about several tens milliseconds). Accordingly, when the photosensor is applied to an image sensor, the configuration accompanying with the outflow of charges from the photoelectric conversion layer or the inflow of charges into the photoelectric conversion layer gives rise to a possibility of causing noise, a residual image, etc. with application of the voltage to the photoelectric conversion layer and the light irradiation at the start of image-taking, etc. On the other hand, with the configuration of setting the bias voltage applied to the photoelectric conversion layer $23p$ to the voltage within the third voltage range during the detection of the light, the occurrence of noise, a residual image, etc. can be suppressed because of not accompanying with the outflow of charges from the photoelectric conversion layer or the inflow of charges into the photoelectric conversion layer.

Furthermore, in the state where the bias voltage within the third voltage range is applied, the hole-electron pairs recombine and disappear promptly (not longer than several tens microseconds) when the incidence of the light upon the photoelectric conversion layer $23p$ is stopped. Hence a high-speed response can be realized with the embodiment of the present disclosure. Since the high-speed response is realized, the photosensor according to the embodiment of the present disclosure can be advantageously applied to range sensing with the time-of-flight method, ultra-high-speed image taking, etc. The first bias voltage applied to the impurity region $20d$ through the power supply wiring line $42$ is 2.4 V, for example, and the second voltage applied to the transparent gate electrode $22g$ through the gate voltage control line $48$ is 2.5 V, for example. Thus, in the example described here, a potential difference of about 0.1 V is applied between the upper and lower surfaces of the gate insulating layer $23$ in the photosensor $100A$. As described later, the detection of the light can also be performed by applying the bias voltage within the first voltage range to the photoelectric conversion layer.

Detection of Infrared Rays

A photoelectric conversion material exhibiting absorption in an infrared region has a narrow bandgap. Activation energy in a current attributable to thermal excitation, the current causing a dark current, is proportional to the bandgap. Accordingly, when the photoelectric conversion material exhibiting absorption in the infrared region is used as a material of the gate insulating layer of the capacitance-modulated transistor, there is a possibility that a sufficient S/N ratio cannot be ensured with generation of a gate leak. The magnitude of a leak current in an organic photoelectric conversion layer alone under application of a bias voltage may be 0.1 V is, for example, about $1 \times 10^{-8}$ A/cm$^2$ (where "x" denotes multiplication).

In the example described here, a photoelectric conversion layer exhibiting absorption in a near infrared region is used as the photoelectric conversion layer $23p$. In the configuration illustrated in FIG. 1, the insulating layer $23x$ is disposed between the photoelectric conversion layer $23p$ and the semiconductor substrate $20$. With the provision of the insulating layer $23x$ between the photoelectric conversion layer $23p$ and the semiconductor substrate $20$, a leak current in the photoelectric conversion layer $23p$ can be reduced, and a demanded S/N ratio can be ensured.

Figure 6:
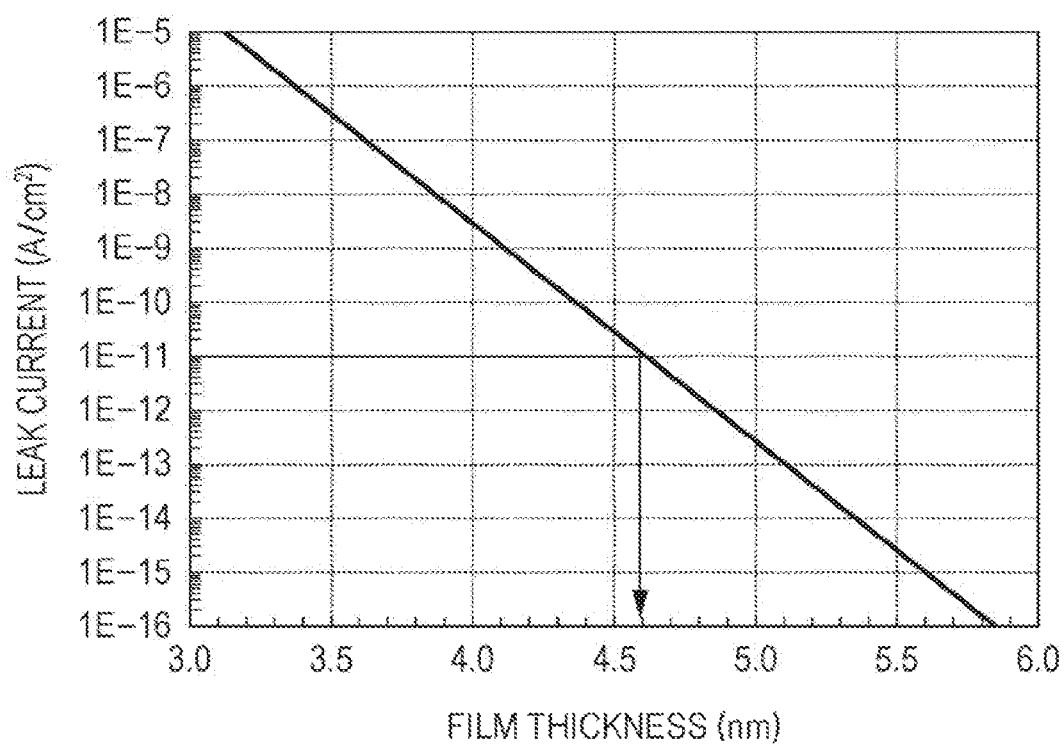
FIG. 6 is a graph depicting dependency, on a film thickness, of a leak current that flows in a thermal oxide film of silicon when a voltage of 0.1 V is applied.

A thermal oxide film of silicon, for example, may be used as the insulating layer $23x$. FIG. 6 depicts dependency, on a film thickness, of a leak current that flows in the thermal oxide film of silicon when a voltage of 0.1 V is applied. In the optical detection method according to the embodiment of the present disclosure, it is advantageous, from the viewpoint of ensuring satisfactory characteristics in a state not under the light irradiation, that the leak current in the gate insulating layer $23$ is not more than $1 \times 10^{-11}$ A/cm$^2$. The magnitude of the leak current at such a level corresponds to a leak amount of not more than 1 e/s on an assumption that an area (gate area) when looking at the gate insulating layer $23$ from the normal direction of the semiconductor substrate $20$ is 1 μm$^2$ ("e" as a unit of the leak amount denotes the number of electrons). As seen from FIG. 6, when the thermal oxide film of silicon is used as the insulating layer $23x$, the leak current can be reduced to a demanded level by setting a thickness of the thermal oxide film to 4.6 nm or more.

In the case of utilizing the above-described third voltage range, the voltage applied between the upper surface and the lower surface of the photoelectric conversion layer $23p$ during the detection of the light is relatively small, namely about 0.1 V, for example. Therefore, it is relatively easy to use a material having a narrow bandgap as the material of the photoelectric conversion layer $23p$. Furthermore, the leak current to the channel region of the capacitance-modulated transistor can be reduced with the provision of the insulating layer $23x$ between the photoelectric conversion layer $23p$ and the semiconductor substrate $20$. In the case of utilizing the third voltage range, the potential difference applied between the impurity region $20d$ and the transparent gate electrode $22g$ is relatively small. Accordingly, an insulating film being relatively thin can be used as the insulating layer $23x$, and information regarding the illuminance can be obtained, for example, in terms of modulation of the drain current.

According to the embodiment of the present disclosure, as described above, it is possible to suppress the dark current and to ensure a high S/N ratio in spite of using the photoelectric conversion material that exhibits absorption in the infrared region and that has a narrow bandgap. As a matter of course, the material constituting the insulating layer $23x$ is not limited to silicon dioxide. A silicon oxynitride film (SiON film), which is generally used in silicon semiconductors, may be used as the insulating layer $23x$. A High-k film, such as a HfO$_2$ film, may also be used. The thickness of the insulating layer $23x$ may be set as appropriate depending on the material that is used to constitute the insulating layer $23x$.

Imaging with use of near infrared rays has promise in the fields of, for example, a night vision system loaded on a vehicle and vital observation, and a photosensor having sensitivity in the infrared region is demanded. As well known, the band gap of silicon is 1.1 eV, and a photosensor using a silicon photodiode cannot detect light with a wavelength of 1100 nm or longer. Although the silicon photodiode has sensitivity in the wavelength range of about 900 nm, the sensitivity is lower than that in the wavelength range of visible light, and an improvement of performance is demanded particularly in applications to the night vision system.

In$_x$Ga$_{1-x}$As is known as a semiconductor having a narrow bandgap. The bandgap of In$_x$Ga$_{1-x}$As can be narrowed to 0.3 eV by adjusting a composition ratio X. A photosensor using In$_x$Ga$_{1-x}$As can be given with sensitivity for a wavelength of 3 μm at maximum, and hence the photosensor using In$_x$Ga$_{1-x}$As can be employed as an infrared sensor. However, an image sensor needs to be cooled in order to suppress degradation of an S/N ratio, which is caused by the dark current attributable to crystal defects and by thermal noise attributable to the narrow bandgap. Accordingly, that type of sensor has a difficulty in reducing the size and the cost, and it has not yet been widely employed for consumer use. A microbolometer and a pyroelectric sensor are known as infrared image sensors not using cooling devices. However, because the microbolometer and the pyroelectric sensor perform detection of infrared rays based on heat, a response speed is as slow as several ten milliseconds, and applications of those sensors are restricted.

According to the embodiment of the present disclosure, it is relatively easy to use, as the photoelectric conversion layer 23p, the material exhibiting absorption in the infrared region. For example, the photoelectric conversion layer containing the tin naphthalocyanine expressed by the above-mentioned formula (3) has an absorption peak in the wavelength range of 80 nm to 1000 nm, as depicted in FIG. 3. The quantum efficiency of the photoelectric conversion layer containing the tin naphthalocyanine expressed by the formula (3) at the wavelength of 900 nm may be about ten times that of silicon. Thus, according to the embodiment of the present disclosure, a photosensor having sensitivity in the infrared region can be realized with a comparatively simple configuration. Since the detection performed by the photosensor according to the embodiment of the present disclosure is not based on heat, generation of thermal noise attributable to temperature change in a channel portion can be avoided, and there is no need of providing a cooling mechanism.

The optical detection device 1000 can be manufactured by employing general semiconductor manufacturing processes. In particular, when a silicon substrate is used as the semiconductor substrate 20, the optical detection device 1000 can be manufactured by utilizing various silicon semiconductor processes. Since the photosensor according to the present disclosure has a similar device structure to that of a field effect transistor, it is also relatively easy to form other transistors and the photosensor according to the present disclosure on the same semiconductor substrate.

Second Embodiment of Optical Sensor

Figure 7:
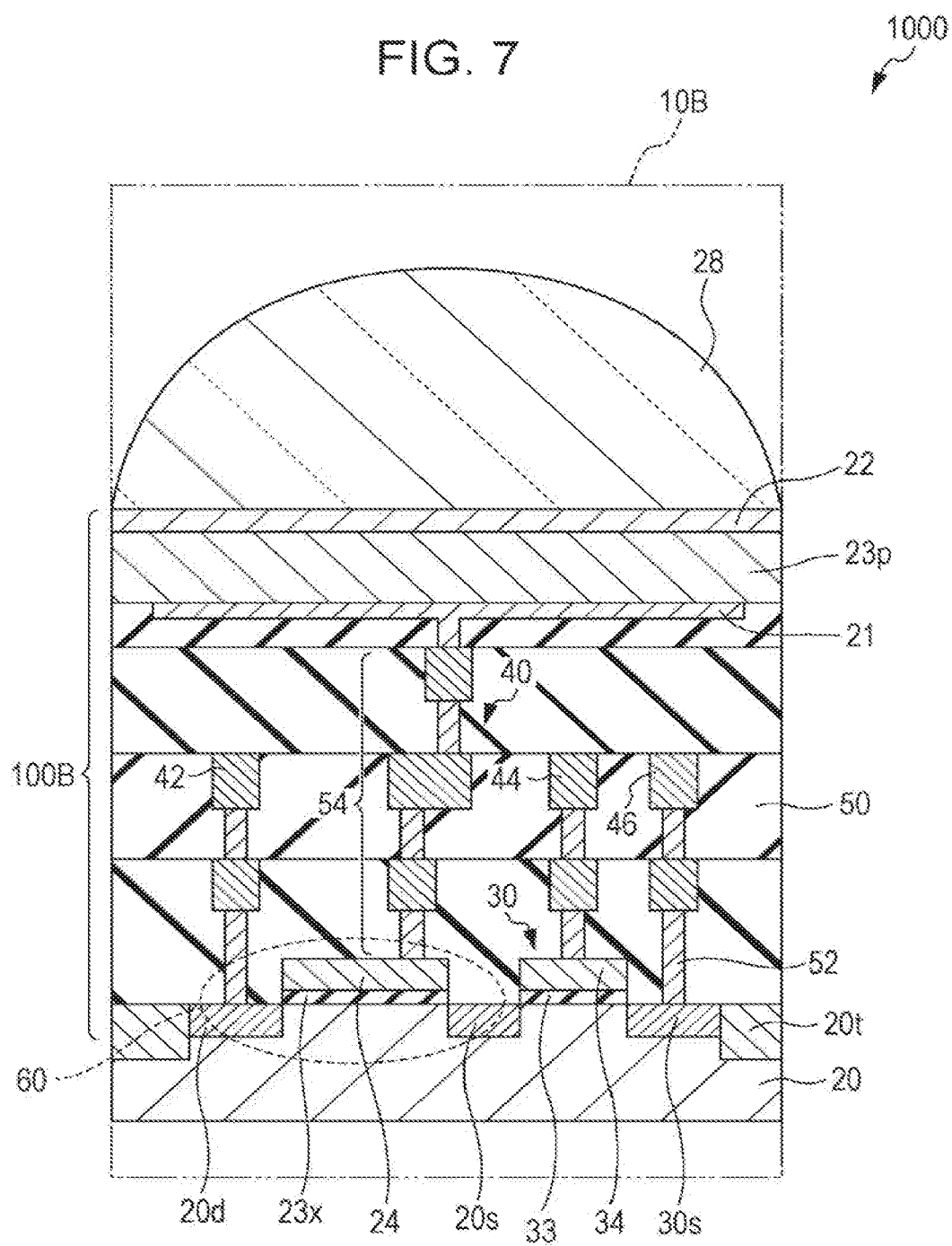
FIG. 7 is a schematic sectional view illustrating a section of an optical detection device according to a second embodiment of the present disclosure.

FIG. 7 schematically illustrates a section of an optical detection device according to a second embodiment of the present disclosure. In the second embodiment, an optical detection device 1000 includes a plurality of unit pixel cells 10B each including a photosensor 100B. In FIG. 7, for the sake of avoiding the drawing from being complicated, only one of the unit pixel cells 10B is illustrated.

In the configuration illustrated in FIG. 7, the photosensor 100B includes a capacitance-modulated transistor 60 and a photoelectric conversion portion. The capacitance-modulated transistor 60 is a field effect transistor formed in and on the semiconductor substrate 20. The capacitance-modulated transistor 60 includes an impurity region 20d, an impurity region 20s, an insulating layer 23x on the semiconductor substrate, and a gate electrode 24 on the insulating layer 23x. The impurity region 20d functions as a drain region (or a source region) of the capacitance-modulated transistor 60, and the impurity region 20s functions as the source region (or the drain region) of the capacitance-modulated transistor 60. As in the first embodiment, the impurity region 20d is connected to the power supply wiring line 42 such that the predetermined voltage (first bias voltage) can be applied to the impurity region 20d during the operation of the optical detection device 1000. The insulating layer 23x serves as a gate insulating layer of the capacitance-modulated transistor 60. The insulating layer 23x is a thermal oxide film of silicon with a thickness of 4.6 nm, for example.

The photoelectric conversion portion of the photosensor 100B includes a pixel electrode 21, a transparent electrode 22 opposing to the pixel electrode 21, and a photoelectric conversion layer 23p sandwiched between the pixel electrode 21 and the transparent electrode 22. The pixel electrode 21 is spatially separated from other adjacent pixel cells 10B, whereby it is electrically isolated from the pixel electrodes 21 of the other pixel cells 10B. The pixel electrode 21 is typically a metal electrode or a metal nitride electrode. Examples of materials usable to form the pixel electrode 21 are Al, Cu, Ti, TiN, Ta, TaN, Mo, Ru, and Pt. Alternatively, the pixel electrode 21 may be formed of, for example, polysilicon that is doped with impurities to be given with conductivity. In this embodiment, a TiN electrode is used as the pixel electrode 21.

The photoelectric conversion layer 23p is formed to extend up to regions of the other unit pixel cells 10B. The photoelectric conversion layer 23p may have a thickness of about 200 nm, for example. Like the transparent gate electrode 22g in the first embodiment, the transparent electrode 22 is also formed to extend up to regions of the other unit pixel cells 10B by employing a TCO. Furthermore, the transparent electrode 22 is connected to the gate voltage control line 48 (not illustrated in FIG. 7, see FIG. 2) such that the predetermined voltage (second bias voltage) can be applied to the transparent electrode 22 during the operation of the optical detection device 1000.

In the illustrated example, the transparent electrode 22 and the photoelectric conversion layer 23p are arranged on the interlayer insulating layer 50. The pixel electrode 21 of the photoelectric conversion portion and the gate electrode 24 of the capacitance-modulated transistor 60 are connected to each other by a connection portion 54, which includes part of the multilayer wiring 40 and a contact plug 52. It can be roughly said that the photosensor 100B according to the second embodiment has a structure in which an electrode (constituted by the pixel electrode 21, the connection portion 54, and the gate electrode 24 in the illustrated example) is interposed between the photoelectric conversion layer 23p and the insulating layer 23x in the photosensor 100A (see FIG. 1) according to the first embodiment. Stated in another way, the capacitance-modulated transistor 60 can be regarded as including a gate insulating layer that includes serial connection of a capacitor having the insulating layer 23x as a dielectric layer and a capacitor having the photoelectric conversion layer 23p as a dielectric layer. In the latter case, it can be said that a multilayer structure including the pixel electrode 21, the connection portion 54, and the gate electrode 24 between the insulating layer 23x and the photoelectric conversion layer 23p constitutes a gate capacitance (which may also be called a gate insulating layer) in the capacitance-modulated transistor 60, and that the transparent electrode 22 constitutes a gate electrode in the capacitance-modulated transistor 60.

The principle of light detection in the optical detection device 1000 according to the second embodiment is substantially the same as that in the first embodiment. More specifically, in a state where a bias voltage within the above-described third voltage range is applied to the photoelectric conversion layer 23p, light is incident upon the photoelectric conversion layer 23p through the transparent electrode 22. The voltage applied to the impurity region 20d is 2.4 V, for example. The voltage applied to the transparent electrode 22 is 2.5 V, for example. Thus, a resultant bias voltage of about 0.1 V is applied between the insulating layer 23x, which serves as the gate insulating layer of the capacitance-modulated transistor 60, and the photoelectric conversion layer 23p.

With incidence of light upon the photoelectric conversion layer 23p, hole-electron pairs are generated inside the photoelectric conversion layer 23p, and the dielectric constant of the photoelectric conversion layer 23p is changed. With the change of the dielectric constant in the photoelectric conversion layer 23p, an effective gate voltage of the capacitance-modulated transistor 60 is changed, and a drain current in the capacitance-modulated transistor 60 is also changed. Accordingly, a change of illuminance of the incident light can be detected, for example, as a voltage change in the vertical signal line 46.

According to the second embodiment, since the photoelectric conversion layer 23p is arranged on the interlayer insulating layer 50, a degree of freedom in layout of various wirings in the multilayer wiring 40 becomes higher than that obtained with the structure (see FIG. 1) in which the photoelectric conversion layer 23p is buried in the interlayer insulating layer 50. In the configuration illustrated in FIG. 7, an aperture ratio in the unit pixel cell 10B is given by a ratio of a region where the pixel electrode 21 and the transparent electrode 22 overlap with each other to the unit pixel cell 10B when the unit pixel cell 10B is viewed from the normal direction of the semiconductor substrate 20. Therefore, a larger aperture ratio can be more easily obtained than in the case of employing the structure (see FIG. 1) in which the photoelectric conversion layer 23p is buried in the interlayer insulating layer 50.

Furthermore, the layout of the photoelectric conversion layer 23p being arranged on the interlayer insulating layer 50 has less difficulty in a manufacturing process than the layout of the photoelectric conversion layer 23p being buried in the interlayer insulating layer 50, and the former layout is more advantageous from the viewpoint of manufacturing. When the gate electrode 24 of the capacitance-modulated transistor 60 and the gate electrode 34 of the address transistor 30 are both polysilicon electrodes, the gate of the address transistor 30 can be formed at the same time as forming the gate of the capacitance-modulated transistor 60.

In another example, when the gate electrode 24 of the capacitance-modulated transistor 60 and the gate electrode 34 of the address transistor 30 are formed using different materials, those gate electrodes need to be formed successively. In the case of forming the gate electrode 24 and the gate electrode 34 and injecting impurities with the lithography technique, it is generally difficult to avoid a deviation in alignment between the gate electrode 24 and the gate electrode 34. Thus, in trying to form the gate electrode 24 of the capacitance-modulated transistor 60 and the gate electrode 34 of the address transistor 30 by using different materials, a margin needs to be set for ensuring the alignment. In other words, using different materials is disadvantageous from the viewpoint of reducing the size of the unit pixel cell in the optical detection device.

By arranging, as illustrated in FIG. 7, the gate electrode 24 of the capacitance-modulated transistor 60 and the gate electrode 34 of the address transistor 30 to be positioned in the same layer (i.e., at a common level), both the gate electrodes can be formed together at desired positions and in desired shapes by employing a common mask and a common material without taking into account a deviation in the alignment. Similarly, by arranging the insulating layer 23x of the capacitance-modulated transistor 60 and the gate insulating layer 33 of the address transistor 30 to be positioned in the same layer, both the insulating layers can be formed together at desired positions and in desired shapes by employing a common mask and a common material without taking into account a deviation in the alignment. Accordingly, the pixels can be formed in smaller sizes. The manufacturing cost can be further reduced by designing a gate structure of the capacitance-modulated transistor 60 and a gate structure of the address transistor 30 in common to each other.

In the above-described first embodiment, the photosensor 100A does not include an electrode corresponding to the gate electrode 24 of the capacitance-modulated transistor 60 (see FIG. 1). However, the insulating layer 23x of the photosensor 100A and the gate insulating layer 33 of the address transistor 30 can be formed by employing a common mask and a common material. This makes it possible to eliminate the necessity of alignment in the case of forming the gate insulating layer 33 after forming the insulating layer 23x, or the necessity of alignment in the case of forming the insulating layer 23x after forming the gate insulating layer 33. Thus, a positional deviation between the insulating layer 23x and the gate insulating layer 33 can be eliminated by designing the insulating layer 23x and the gate insulating layer 33 to be positioned in the same layer.

By forming the pixel electrode 21 as an electrode with a light-shielding property, stray light can be suppressed from entering the channel region of the capacitance-modulated transistor 60 and/or the channel region of the address transistor 30. An optical filter, such as an infrared transmission filter, may be disposed between the transparent electrode 22 and the microlens 28.

The device structure illustrated in FIG. 7 apparently seems like a device structure of a stacked image sensor in which a photoelectric conversion layer is disposed on a semiconductor substrate. In the stacked image sensor, however, a comparatively high bias voltage is applied between a pixel electrode and a transparent electrode opposing to the pixel electrode, and ones of holes and electrons both generated in the photoelectric conversion layer with light irradiation are collected as signal charges to the pixel electrode. The collected signal charges are temporarily accumulated in a floating diffusion within a unit pixel cell, and a signal voltage corresponding to an amount of the accumulated charges is read out at predetermined timing.

On the other hand, in the photosensor of the present disclosure, holes and electrons generated in the photoelectric conversion layer 23p are not drifted toward the electrodes, and an electrical signal corresponding to a change of the dielectric constant of the photoelectric conversion layer 23p is read out. Only ones of the holes and the electrons can be utilized as signal charges in the stacked image sensor, whereas the holes and the electrons are both utilized in pairs to cause a change of the drain current in the photosensor of the present disclosure. Hence higher sensitivity can be realized. Furthermore, since the potential difference applied between the upper surface and the lower surface of the photoelectric conversion layer 23p is set to the value within the above-mentioned third voltage range, the generated pairs of holes and electrons promptly recombine when the light irradiation is stopped. Thus, unlike the stacked image sensor, an operation of resetting the potential of the pixel electrode is not required. In addition, the photosensor of the present disclosure does not perform an operation of accumulating the holes or the electrons, which are generated in the photoelectric conversion layer 23p, as the signal charges in the floating diffusion. For that reason, the semiconductor substrate 20 does not have a charge accumulation region to accumulate the signal charges, unlike the stacked image sensor.

As described above, when the potential difference applied between the upper surface and the lower surface of the photoelectric conversion layer 23p is set to the value within the above-mentioned third voltage range, the generated pairs of holes and electrons promptly recombine when the light irradiation is stopped. This implies that an output of the photosensor represents a variation corresponding to a change of the illuminance in the state under the light irradiation, and that the output does not depend on an integrated amount of light. Accordingly, when the potential difference applied between the upper surface and the lower surface of the photoelectric conversion layer 23p is set to the value within the above-mentioned third voltage range, the timing of exposure and the timing of reading out a signal can be basically made coincident with each other.

A capacitor having one electrode electrically connected to the impurity region 20s or 30s (see, for example, FIG. 7) in the semiconductor substrate 20 may be disposed in the unit pixel cell. When such a capacitor is disposed in the unit pixel cell, the output signal can be read out at timing different from the timing of exposure of the photosensor.

Third Embodiment of Optical Sensor

Figure 8:
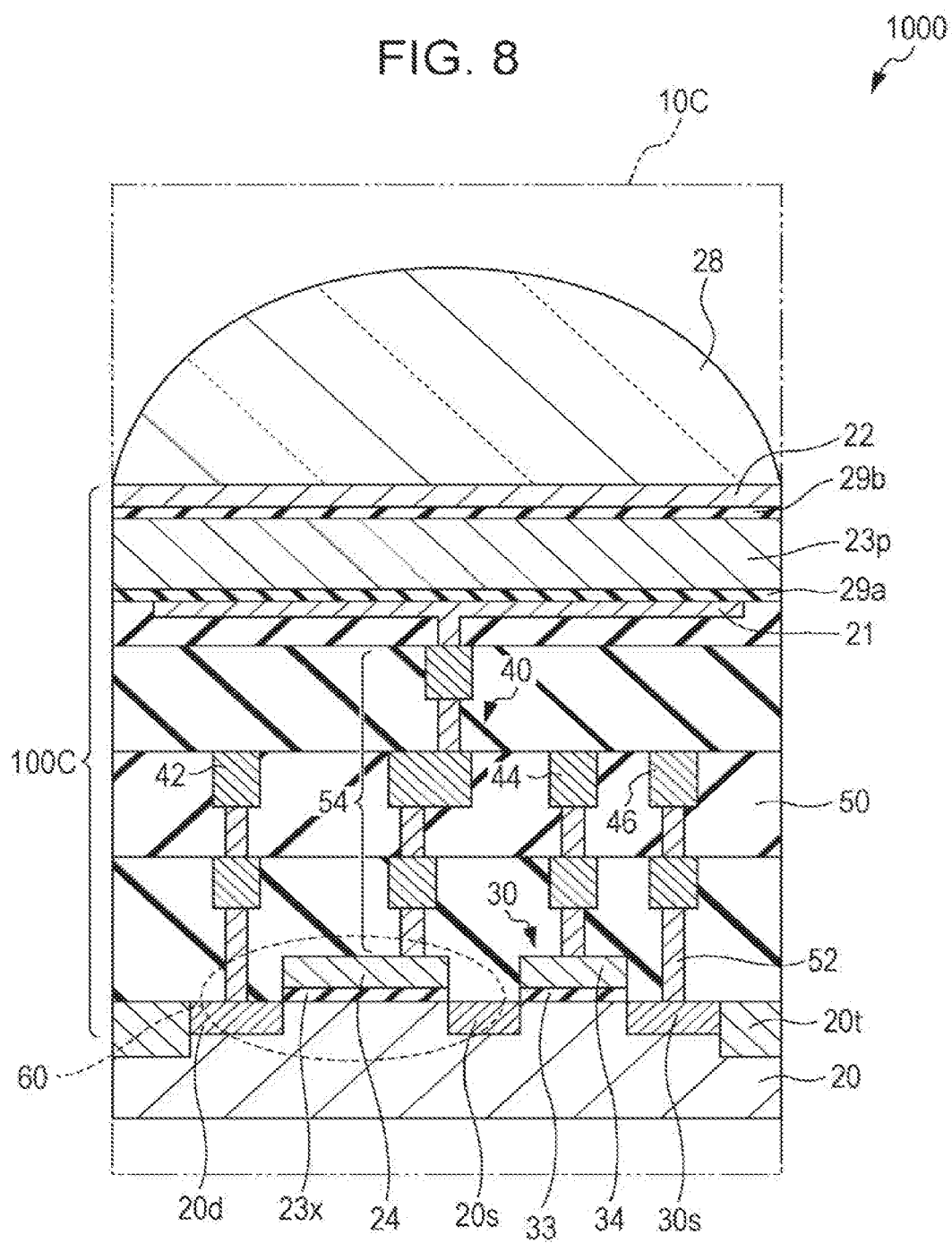
FIG. 8 is a schematic sectional view illustrating a section of an optical detection device according to a third embodiment of the present disclosure.

FIG. 8 schematically illustrates a section of an optical detection device according to a third embodiment of the present disclosure. A photosensor 100C in a unit pixel cell 10C, illustrated in FIG. 8, is different from the photosensor 1008 in the second embodiment, described above with reference to FIG. 7, in that a photoelectric conversion portion of the photosensor 100C includes an insulating layer disposed between the photoelectric conversion layer 23p and an electrode (i.e., one or each of a pixel electrode 21 and a transparent electrode 22). In a configuration illustrated in FIG. 8, insulating layers 29a and 29b are disposed respectively between the pixel electrode 21 and the photoelectric conversion layer 23p and between the photoelectric conversion layer 23p and the transparent electrode 22.

For example, a material exhibiting a smaller leak current than a material constituting the photoelectric conversion layer 23p can be selected to constitute the insulating layers 29a and 29b. In this embodiment, a silicon oxide film having a thickness of 5.4 nm is used as each of the insulating layers 29a and 29b. The silicon oxide film can be formed by CVD, for example.

According to the configuration illustrated in FIG. 8, since the insulating layers 29a and 29b are disposed respectively between the pixel electrode 21 and the photoelectric conversion layer 23p and between the photoelectric conversion layer 23p and the transparent electrode 22, a larger bias voltage can be applied between the drain region (or the source region) of the capacitance-modulated transistor 60 and the transparent electrode 22. In an example described below, a voltage of 1.2 V is applied as the first bias voltage to the impurity region 20d, and a voltage of 3.7 V is applied as the second bias voltage to the transparent electrode 22. Thus, in this embodiment, a potential difference of about 2.5 V is applied between the impurity region 20d and the transparent electrode 22.

Figure 9:
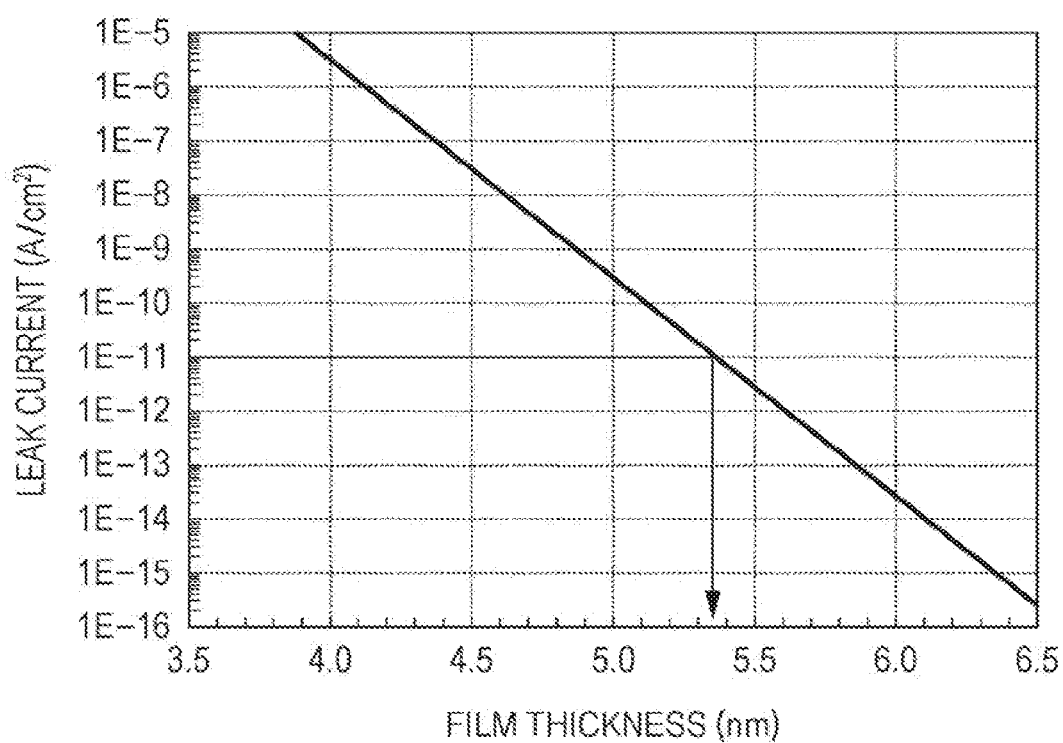
FIG. 9 is a graph depicting dependency, on a film thickness, of a leak current that flows in a thermal oxide film of silicon when a voltage of 2.5 V is applied.

FIG. 9 depicts dependency, on a film thickness, of a leak current that flows in a silicon oxide film when a voltage of 2.5 V is applied. As described before, it is advantageous, from the viewpoint of ensuring satisfactory characteristics in the state not under the light irradiation, that the leak current to the channel region of the capacitance-modulated transistor 60 is not more than $1 \times 10^{-11}$ A/cm$^2$. As seen from FIG. 9, when the voltage of 2.5 V is applied to the silicon oxide film, the leak current in the silicon oxide film can be reduced down to $1 \times 10^{-11}$ A/cm$^2$ or less by setting a thickness of the silicon oxide film to 5.4 nm or more.

Referring to FIG. 8 again, in the configuration illustrated in FIG. 8, the voltage applied between the impurity region 20d and the transparent electrode 22 is divided among the insulating layer 23x, the insulating layer 29a, the insulating layer 29b, and the photoelectric conversion layer 23p, each of which constitute a capacitor. Accordingly, a voltage actually applied to each of the insulating layer 23x, the insulating layer 29a, and the insulating layer 29b is about 0.8 V. In a strict sense, therefore, it is not necessary for each of the insulating layer 29a and the insulating layer 29b to have a thickness of 5.4 nm. In this embodiment, the thickness of each of the insulating layer 29a and the insulating layer 29b is set to a value of 5.4 nm, taking into account characteristic variations of silicon oxide films that are formed by CVD.

Thus, with the provision of at least one insulating layer (i.e., the insulating layer 29a and the insulating layer 29b in the illustrated example) between the photoelectric conversion layer 23p and the electrode, a larger bias voltage can be applied between the drain region (or the source region) of the capacitance-modulated transistor 60 and the transparent electrode 22. For example, the bias voltage providing a potential difference between the upper surface and the lower surface of the photoelectric conversion layer 23p, the potential difference falling within the above-mentioned first voltage range, may be applied between the drain region (or the source region) of the capacitance-modulated transistor 60 and the transparent electrode 22.

When the photoelectric conversion layer 23p is irradiated with the light in the state where the bias voltage within the first voltage range (see FIG. 5) is applied to the photoelectric conversion layer 23p, ones of holes and electrons both generated with photoelectric conversion drift toward the transparent electrode 22, and the others drift toward the pixel electrode 21. Thus, in the case of applying the bias voltage within the first voltage range to the photoelectric conversion layer 23p, because positive charges and negative charges generated with the photoelectric conversion are separated, a time until the pairs of holes and electrons recombine after stopping the light irradiation is longer than that in the case of applying the bias voltage within the third voltage range to the photoelectric conversion layer 23p. Accordingly, the timing of exposure and the timing of reading out a signal are not always required to be coincident with each other. Since the timing of exposure and the timing of reading out a signal can be made different from each other in a comparatively easy manner, applying the bias voltage within the first voltage range to the photoelectric conversion layer 23p is advantageous from one point of view when the photosensor is applied to an image sensor.

In the state where the bias voltage within the first voltage range is applied to the photoelectric conversion layer 23p, the insulating layer 29a between the photoelectric conversion layer 23p and the pixel electrode 21 is able to function as a capacitor that accumulates ones of the holes and the electrons both generated with the photoelectric conversion. With the accumulation of charges in that capacitor, electrostatic induction occurs in the connection portion 54, whereby an effective gate voltage in the capacitance-modulated transistor 60 is changed. Accordingly, the magnitude of a drain current in the capacitance-modulated transistor 60 is changed. After the end of reading-out of the output signal, a reset operation of resetting the charges accumulated in the insulating layer 29a, which serves as a capacitor, is executed, for example, by applying a voltage having a polarity reversed to that of the second bias voltage to the transparent electrode 22. In another example, the charges accumulated in the insulating layer 29a, which serves as a capacitor, and the charges accumulated in the insulating layer 29b, which also serves as a capacitor, may be caused to recombine by blocking the light with a mechanical shutter, for example. As a matter of course, the operation of detecting the light may be performed in the state where the bias voltage within the above-mentioned third voltage range is applied to the photoelectric conversion layer 23p. In that case, the operation of resetting the charges is not needed.

Thus, the insulating layers may be disposed respectively between the photoelectric conversion layer 23p and the pixel electrode 21 and between the photoelectric conversion layer 23p and the transparent electrode 22. With the provision of the insulating layers between the photoelectric conversion layer 23p and the pixel electrode 21 and between the photoelectric conversion layer 23p and the transparent electrode 22, even when the potential difference between the impurity region 20d and the transparent electrode 22 is increased, the charges generated with the photoelectric conversion can be suppressed from drifting to the outside of the photoelectric conversion layer 23p. Hence the occurrence of a residual image can be suppressed. From the viewpoint of suppressing drift of the charges to the outside of the photoelectric conversion layer 23p, it is just needed to dispose the insulating layer at least one of boundaries between the photoelectric conversion layer 23p and the pixel electrode 21 and between the photoelectric conversion layer 23p and the transparent electrode 22. Instead of the silicon oxide film, a silicon nitride film, an aluminum oxide film, or the like may be used as the insulating layer 29a and/or the insulating layer 29b.

The above embodiments have been described in connection with the example in which the transistors in the unit pixel cell, such as the capacitance-modulated transistor 60 and the address transistor 30, are each an N-channel MOS. However, the transistors used in embodiments of the present disclosure are not limited to N-channel MOS's. The capacitance-modulated transistor 60 and the address transistor 30 may be each an N-channel MOS or a P-channel MOS. Additionally, it is not always required that those transistors are all N-channel MOS's or P-channel MOS's. Other than an FET, a bipolar transistor can also be used as the address transistor 30. For example, the address transistor 30 may be a bipolar transistor. Carriers in the channel formed between the impurity region 20d and the impurity region 20s in the photosensor 100A may be electrons or holes.

Camera System

Figure 10:
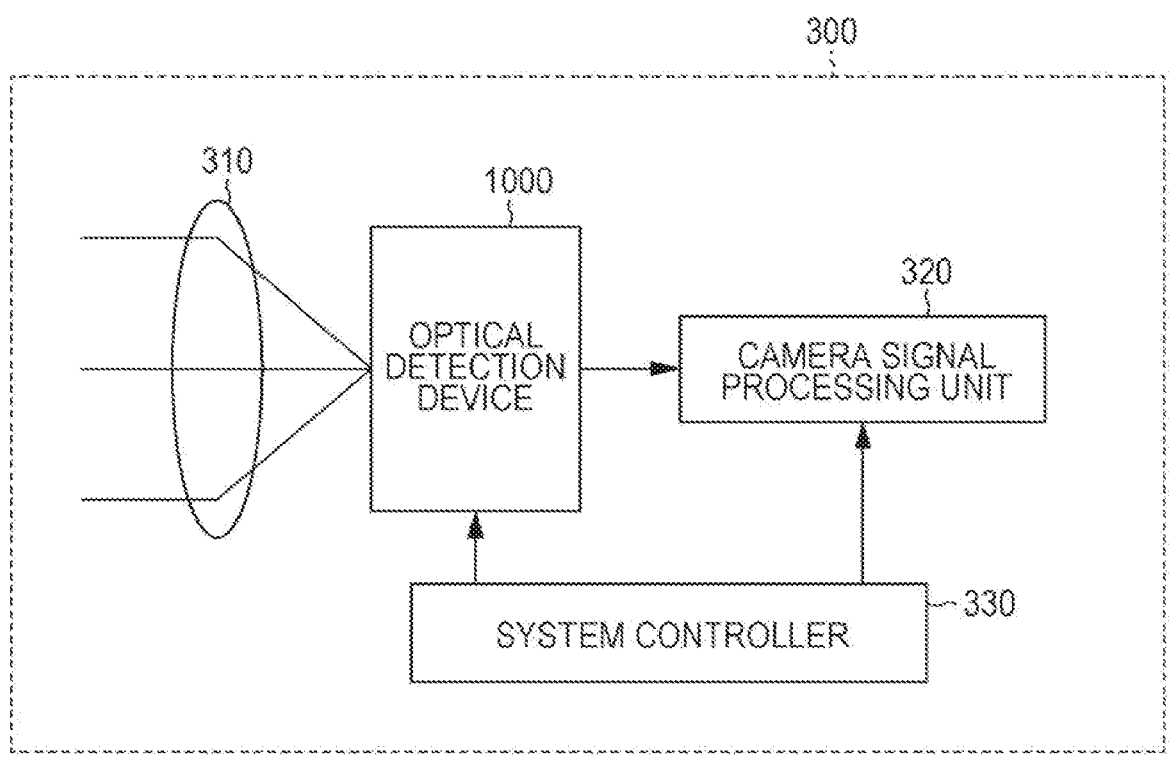
FIG. 10 is a block diagram illustrating an exemplary configuration of a camera system according to a fourth embodiment of the present disclosure.

FIG. 10 schematically illustrates an exemplary configuration of a camera system according to a fourth embodiment of the present disclosure. A camera system 300 illustrated in FIG. 10 includes a lens optical system 310, the above-described optical detection device 1000, a system controller 330, and a camera signal processing unit 320.

The lens optical system 310 includes, for example, an autofocusing lens, a zooming lens, and a diaphragm. The lens optical system 310 condenses light onto an imaging surface of the optical detection device 1000. When the photoelectric conversion layer 23p of the photosensor is formed of a material that exhibits absorption in the wavelength range of visible light, a color filter may be disposed on the imaging surface of the optical detection device 1000. The optical detection device 1000 may include, as peripheral circuits, a column signal processing circuit (also called a "row signal accumulation circuit"), a horizontal signal reading-out circuit (also called a "column scanning circuit"), etc.

The system controller 330 controls the entirety of the camera system 300. The system controller 330 may be implemented with a microcomputer, for example.

The camera signal processing unit 320 functions as a signal processing circuit that processes the output signal from the optical detection device 1000. The camera signal processing unit 320 executes processes such as gamma correction, a color interpolation process, a spatial interpolation process, and auto white balance. The camera signal processing unit 320 may be implemented with a digital signal processor (DSP), for example.

At least one of the system controller 330 and the camera signal processing unit 320 may be formed on the semiconductor substrate 20 of the optical detection device 1000. A size of the camera system 300 can be reduced by manufacturing, as a single semiconductor device, not only at least one of the system controller 330 and the camera signal processing unit 320, but also the optical detection device 1000.

The optical sensor of the present disclosure can be employed as an optical detection device, an image sensor, etc. The optical sensor can also take an image with infrared rays by appropriately selecting the material of the photoelectric conversion layer. The optical sensor taking an image with infrared rays can be applied to a security camera or a camera mounted on a vehicle, for example. The vehicle-mounted camera may be utilized, for example, to provide an input for a controller in order to ensure safe running of the vehicle. Alternatively, the vehicle-mounted camera may be utilized to assist an operator for the purpose of safe running of the vehicle.

What is claimed is:

1. An optical sensor comprising:
   a semiconductor layer including a first region, a second region, and a third region between the first region and the second region;
   a first electrode facing to the semiconductor layer;
   a photoelectric conversion layer between the third region and the first electrode; and
   voltage supply circuitry that applies a predetermined voltage between the first electrode and the first region to apply a bias voltage to the photoelectric conversion layer, wherein
   the photoelectric conversion layer has a photocurrent characteristic showing how a current density of current flowing through the photoelectric conversion layer varies with the bias voltage applied to the photoelectric conversion layer, the photocurrent characteristic including a first voltage range where an absolute value of the current density increases as the bias voltage increases in a reverse direction, a second voltage range where the current density increases as the bias voltage increases in a forward direction, and a third voltage range where an absolute value of a rate of change of the current density relative to the bias voltage is less than in the first voltage range and the second voltage range, the third voltage range being between the first voltage range and the second voltage range, and
   the voltage supply circuitry applies the predetermined voltage between the first electrode and the first region such that the bias voltage falls within the third voltage range.

2. The optical sensor according to claim 1, further comprising a first insulating layer between the photoelectric conversion layer and the third region.

3. The optical sensor according to claim 1, further comprising a light-shielding film between the gate electrode and the semiconductor layer.

4. An optical sensor comprising:
a first electrode;
a second electrode facing to the first electrode;
a photoelectric conversion layer between the first electrode and the second electrode;
a transistor having a gate, a source and a drain, the gate being electrically connected to the first electrode; and
voltage supply circuitry that applies a predetermined voltage between the second electrode and one of the source and the drain to apply a bias voltage to the photoelectric conversion layer, wherein
the photoelectric conversion layer has a photocurrent characteristic showing how a current density of current flowing through the photoelectric conversion layer varies with the bias voltage applied to the photoelectric conversion layer, the photocurrent characteristic including a first voltage range where an absolute value of the current density increases as the bias voltage increases in a reverse direction, a second voltage range where the current density increases as the bias voltage increases in a forward direction, and a third voltage range where an absolute value of a rate of change of the current density relative to the bias voltage is less than in the first voltage range and the second voltage range, the third voltage range being between the first voltage range and the second voltage range, and
the voltage supply circuitry applies the predetermined voltage between the second electrode and the one of the source and the drain such that the bias voltage falls within the third voltage range.

5. The optical sensor according to claim 4, wherein the first electrode has a light-shielding property.

6. The optical sensor according to claim 4, further comprising at least one of a first insulating layer and a second insulating layer, the first insulating layer being sandwiched between the first electrode and the photoelectric conversion layer, the second insulating layer being sandwiched between the second electrode and the photoelectric conversion layer.

7. The optical sensor according to claim 1, wherein the third voltage range is −1 V or more and 1 V or less.

8. The optical sensor according to claim 4, wherein the third voltage range is −1 V or more and 1 V or less.

9. The optical sensor according to claim 1, wherein the current density is 100 µA/cm$^2$ or less when the bias voltage falls within the third voltage range.

10. The optical sensor according to claim 4, wherein the current density is 100 µA/cm$^2$ or less when the bias voltage falls within the third voltage range.

11. The optical sensor according to claim 1, wherein the predetermined voltage falls within the third voltage range.

12. The optical sensor according to claim 4, wherein the predetermined voltage falls within the third voltage range.

13. The optical sensor according to claim 1, wherein the photoelectric conversion layer includes a p-type semiconductor material and an n-type semiconductor material.

14. The optical sensor according to claim 4, wherein the photoelectric conversion layer includes a p-type semiconductor material and an n-type semiconductor material.

15. The optical sensor according to claim 1, wherein
the first electrode functions as a gate,
the first region functions as one of a source and a drain,
the second region functions as the other of the source and the drain, and
the photoelectric conversion layer functions as a gate insulating layer.

16. The optical sensor according to claim 2, wherein
the first electrode functions as a gate,
the first region functions as one of a source and a drain,
the second region functions as the other of the source and the drain, and
the photoelectric conversion layer and the first insulating layer function as a gate insulating layer.

17. The optical sensor according to claim 1, further comprising signal detection circuitry connected to the second region.

18. The optical sensor according to claim 4, further comprising signal detection circuitry connected to the second region.

* * * * *